(12) United States Patent
Mori

(10) Patent No.: US 12,237,352 B2
(45) Date of Patent: Feb. 25, 2025

(54) SOLID-STATE IMAGING ELEMENT HAVING PARTITION WALL DISPOSED BETWEEN OPTICAL FILTERS

(71) Applicant: FUJIFILM Corporation, Tokyo (JP)

(72) Inventor: Masahiro Mori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 400 days.

(21) Appl. No.: 17/739,281

(22) Filed: May 9, 2022

(65) Prior Publication Data

US 2022/0271078 A1 Aug. 25, 2022

Related U.S. Application Data

(63) Continuation of application No. PCT/JP2020/042704, filed on Nov. 17, 2020.

(30) Foreign Application Priority Data

Nov. 26, 2019 (JP) ................................ 2019-212900

(51) Int. Cl.
 *H01L 27/146* (2006.01)
(52) U.S. Cl.
 CPC .. *H01L 27/14621* (2013.01); *H01L 27/14685* (2013.01); *H01L 27/14645* (2013.01)
(58) Field of Classification Search
 CPC ......... H01L 27/14621; H01L 27/14685; H01L 27/14645
 See application file for complete search history.

(56) References Cited

U.S. PATENT DOCUMENTS

2014/0071316 A1 3/2014 Asano et al.
2014/0339665 A1* 11/2014 Tani .................. G02B 5/201
  257/432

(Continued)

FOREIGN PATENT DOCUMENTS

JP 2012-238774 A 12/2012
JP 2014-63125 A 4/2014

(Continued)

OTHER PUBLICATIONS

Japanese Notice of Reasons for Refusal for Japanese Application No. 2021-561324, dated Oct. 17, 2023, with an English translation.

(Continued)

*Primary Examiner* — Michael Jung
(74) *Attorney, Agent, or Firm* — Birch, Stewart, Kolasch & Birch, LLP

(57) ABSTRACT

Provided is a solid-state imaging element including a support 1 having a photoelectric conversion unit 10 and an optical filter 20 provided on a light incident side with respect to the photoelectric conversion unit 10. The optical filter 20 has two or more kinds of pixels 21, 22, and 23 arranged in a patterned manner and a partition wall 25 disposed between the pixels. A refractive index of the partition wall with respect to light having a wavelength of 533 nm is 1.10 to 1.30, a width W1 of the partition wall is 80 to 150 nm, a refractive index of the pixels with respect to light having a wavelength of 1000 nm is 1.60 to 1.90, a difference between a thickness H1 of the partition wall and a thickness H2 of pixels adjacent to the partition wall is 200 nm or less, and a difference between the refractive index of the partition wall with respect to light having a wavelength of 533 nm and a refractive index of the pixels adjacent to the partition wall with respect to light having a wavelength of 1000 nm is 0.30 to 0.80.

11 Claims, 2 Drawing Sheets

(56) References Cited

U.S. PATENT DOCUMENTS

| | | | |
|---|---|---|---|
| 2014/0346629 A1* | 11/2014 | Naya | G02B 5/201 |
| | | | 257/432 |
| 2015/0228689 A1* | 8/2015 | Lenchenkov | H01L 27/14649 |
| | | | 257/432 |
| 2016/0301897 A1* | 10/2016 | Huang | H04N 25/134 |
| 2017/0017023 A1 | 1/2017 | Sugiyama et al. | |
| 2018/0295295 A1* | 10/2018 | Hicks | H01L 27/1464 |
| 2019/0221596 A1 | 7/2019 | Oota et al. | |
| 2020/0013821 A1 | 1/2020 | Oota et al. | |
| 2020/0052021 A1 | 2/2020 | Takahashi | |
| 2020/0119071 A1 | 4/2020 | Takishita et al. | |
| 2021/0375971 A1* | 12/2021 | Tayanaka | H01L 27/14629 |

FOREIGN PATENT DOCUMENTS

| | | |
|---|---|---|
| KR | 10-2019-0035913 A | 4/2019 |
| KR | 10-2019-0116456 A | 10/2019 |
| WO | WO 2016/114362 A1 | 7/2016 |
| WO | WO 2018/174147 A1 | 9/2018 |
| WO | WO 2018/194069 A1 | 10/2018 |
| WO | WO 2019/039172 A1 | 2/2019 |

OTHER PUBLICATIONS

International Preliminary Report on Patentability, dated Jun. 9, 2022, and Written Opinion of the International Searching Authority, dated May 17, 2022, for International Application No. PCT/JP2020/042704, with an English translation.
International Search Report for International Application No. PCT/JP2020/042704, dated Feb. 9, 2021, with an English translation.
Japanese Notice of Reasons for Refusal for Japanese Application No. 2021-561324, dated Jun. 6, 2023, with an English translation.
Korean Office Action dated Sep. 9, 2023 for Application No. 10-2022-7016637 with an English translation.
Korean Office Action for Korean Application No. 10-2022-7016637, dated Apr. 2, 2024, with an English translation.
Taiwanese Office Action and Search Report for Taiwanese Application No. 109140869, dated Mar. 19, 2024, with a partial English translation.

* cited by examiner

SOLID-STATE IMAGING ELEMENT HAVING PARTITION WALL DISPOSED BETWEEN OPTICAL FILTERS

CROSS-REFERENCE TO RELATED APPLICATIONS

This application is a Continuation of PCT international Application No. PCT/JP2020/042704 filed on Nov. 17, 2020, which claims priority under 35 U.S.C § 119(a) to Japanese Patent Application No. 2019-212900 filed on Nov. 26, 2019. Each of the above application(s) is hereby expressly incorporated by reference, in its entirety, into the present application.

BACKGROUND OF THE INVENTION

1. Field of the Invention

The present invention relates to a solid-state imaging element including an optical filter.

2. Description of the Related Art

In recent years, as a digital camera, a mobile phone with a camera, and the like have been further spreading, there has been a greatly increasing demand for a solid-state imaging element such as a charge coupled device (CCD) image sensor.

As one aspect of the solid-state imaging element, a solid-state imaging element which includes an optical filter such as a color filter having two or more kinds of pixels arranged in a patterned manner and a partition wall disposed between the pixels has been known.

In addition, JP2012-238774A discloses an invention relating to an imaging apparatus that includes an image pick-up optical system including a lens group and an aperture stop and a solid-state imaging element which captures an image formed on an imaging plane of the image pick-up optical system, in which the solid-state imaging element is an imaging element having a plurality of pixels on a substrate, and includes a photoelectric conversion layer consisting of an organic material and a color filter layer consisting of color filters of two or more colors which are arranged above the photoelectric conversion layer and a transparent separation wall which separates the color filters of each color, a thickness of the photoelectric conversion layer is 0.1 μm to 1 μm, all refractive indexes of the color filters of each color are 1.5 to 1.8, a width of the separation wall is 0.05 μm to 0.2 μm, and a refractive index of the separation wall is 1.22 to 1.34.

SUMMARY OF THE INVENTION

In the solid-state imaging element including the optical filter, an angle of light incident on a pixel located in a central portion of a photoelectric conversion unit may be different from an angle of light incident on a pixel in a peripheral portion of the photoelectric conversion unit. For example, light is likely to be incident on the pixel located in the central portion of the photoelectric conversion unit from a substantially vertical direction, but light is likely to be incident on the pixel in the peripheral portion of the photoelectric conversion unit from an oblique direction.

However, in a case where the light is incident on the pixels of the optical filter from an oblique direction, light leak to other adjacent pixels occurs, and an amount of the light incident on the photoelectric conversion unit tends to be smaller than a case where the light is incident on the pixels of the optical filter from a vertical direction. Therefore, the incident amount of light varies between the pixel located in the central portion of the photoelectric conversion unit and the pixel located in the peripheral portion of the photoelectric conversion unit, and thus there is a tendency for variations in sensitivity characteristics to occur.

In addition, in recent years, miniaturization and high resolution of the solid-state imaging element are progressed, and along with this, a pixel size used in the optical filter such as a color filter used in the solid-state imaging element is also finer. As the pixel size is finer, in a case where light from an oblique direction is incident on a pixel, the amount of light incident on the photoelectric conversion unit tends to be smaller, and there is a tendency for variations in the incident amount of light to occur more easily between the central portion and the peripheral portion of the photoelectric conversion unit.

Therefore, an object of the present invention is to provide a solid-state imaging element in which a difference between a sensitivity to vertically incident light and a sensitivity to obliquely incident light is reduced and a variation in sensitivity characteristics is suppressed.

According to the studies conducted by the present inventors, it has been found that the above-described object can be achieved by adopting the configuration shown below, thereby leading to the completion of the present invention. Therefore, the present invention provides the following.

<1> A solid-state imaging element comprising:
a support having a photoelectric conversion unit; and
an optical filter provided on a light incident side with respect to the photoelectric conversion unit,
in which the optical filter has two or more kinds of pixels arranged in a patterned manner and a partition wall disposed between the pixels,
a refractive index of the partition wall with respect to light having a wavelength of 533 nm is 1.10 to 1.30,
a width of the partition wall is 80 to 150 nm,
a refractive index of the pixels with respect to light having a wavelength of 1000 nm is 1.60 to 1.90,
a difference between a thickness of the partition wall and a thickness of pixels adjacent to the partition wall is 200 nm or less, and
a difference between the refractive index of the partition wall with respect to light having a wavelength of 533 nm and a refractive index of the pixels adjacent to the partition wall with respect to light having a wavelength of 1000 nm is 0.30 to 0.80.

<2> The solid-state imaging element according to <1>, in which the thickness of the partition wall is 300 to 650 nm.

<3> The solid-state imaging element according to <1> or <2>,
in which a thickness of the pixels is 300 to 600 nm.

<4> The solid-state imaging element according to any one of <1> to <3>,
in which a width of the pixels is 300 to 1100 nm.

<5> The solid-state imaging element according to any one of <1> to <4>,
in which a pixel pitch of the optical filter is 400 to 1200 nm.

<6> The solid-state imaging element according to any one of <1> to <5>,
in which the difference between the thickness of the partition wall and the thickness of pixels adjacent to the partition wall is 1 nm or more.

<7> The solid-state imaging element according to any one of <1> to <6>,
in which the thickness of the partition wall is larger than a thickness of the pixels.
<8> The solid-state imaging element according to any one of <1> to <7>,
in which a void ratio of the partition wall is 20% to 80%.
<9> The solid-state imaging element according to any one of <1> to <8>,
in which the partition wall includes at least one kind selected from silica particles having a shape in which a plurality of spherical silica particles are linked in a beaded shape or silica particles having a hollow structure.
<10> The solid-state imaging element according to any one of <1> to <9>, further comprising:
an underlayer between the partition wall and a pixel side.
<11> The solid-state imaging element according to any one of <1> to <10>,
in which a surface roughness Ra value of the pixels is 0.1 to 5.0 nm.
<12> The solid-state imaging element according to any one of <1> to <11>,
in which the optical filter includes at least one kind of pixel selected from a yellow pixel, a cyan pixel, or a magenta pixel.

According to the present invention, it is possible to provide a solid-state imaging element in which a variation in sensitivity characteristics is suppressed.

DESCRIPTION OF THE PREFERRED EMBODIMENTS

Figure 1:
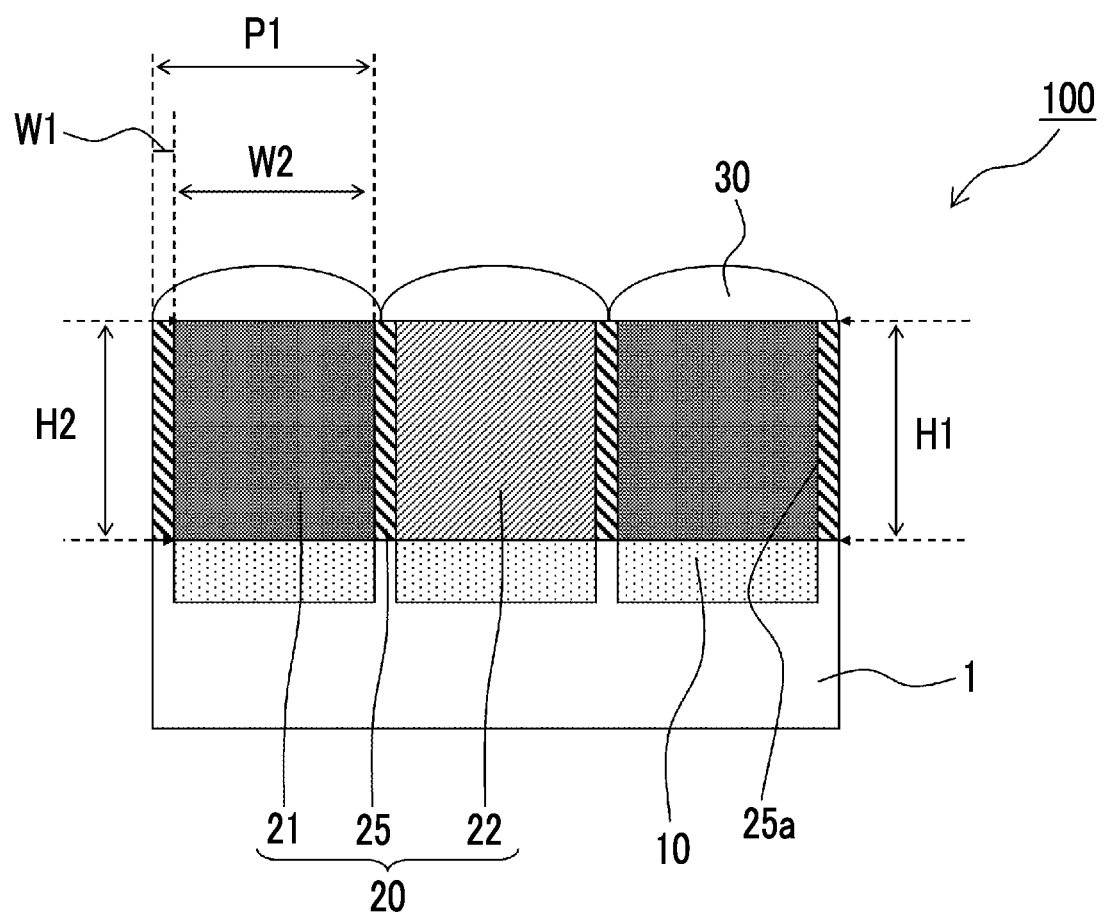
FIG. 1 is a side sectional view showing one embodiment of a solid-state imaging element.

Hereinafter, main embodiments of the present invention will be described. However, the present invention is not limited to the specified embodiments.

In the present specification, a numerical range expressed using the term "to" means a range which includes the preceding and succeeding numerical values of "to" as a lower limit value and an upper limit value, respectively.

In the description of a group (atomic group) in the present specification, in a case where the group is described without specifying whether the group is substituted or unsubstituted, the description means that the group includes both a group having no substituent and a group having a substituent. For example, in a case where a group is simply described as an "alkyl group", the description means that the alkyl group includes both an alkyl group having no substituent (unsubstituted alkyl group) and an alkyl group having a substituent (substituted alkyl group).

In the present specification, "(meth)acrylate" means both "acrylate" and "methacrylate" or either of them, "(meth) acryl" means both "acryl" and "methacryl" or either of them, and "(meth)acryloyl" means both "acryloyl" or "methacryloyl" or either of them.

In the present specification, a concentration of solid content in a composition is represented by a mass percentage of other components excluding a solvent with respect to the total mass of the composition.

In the present specification, a weight-average molecular weight (Mw) and a number-average molecular weight (Mn) are each expressed as a value in terms of polystyrene according to gel permeation chromatography (GPC measurement), unless otherwise specified.

In the present specification, unless otherwise specified, a direction in which layers are stacked on a support is referred to as "upper". Furthermore, the opposite direction is referred to as "lower". Such vertical settings are for convenience of explanation in the present specification, and in practice, an "upward" direction in the present specification may differ from the vertically upward direction.

<Solid-State Imaging Element>

A solid-state imaging element according to an embodiment of the present invention includes a support having a photoelectric conversion unit and an optical filter provided on a light incident side with respect to the photoelectric conversion unit, in which the optical filter has two or more kinds of pixels arranged in a patterned manner and a partition wall disposed between the pixels, a refractive index of the partition wall with respect to light having a wavelength of 533 nm is 1.10 to 1.30, a width of the partition wall is 80 to 150 nm, a refractive index of the pixels with respect to light having a wavelength of 1000 nm is 1.60 to 1.90, a difference between a thickness of the partition wall and a thickness of pixels adjacent to the partition wall is 200 nm or less, and a difference between the refractive index of the partition wall with respect to light having a wavelength of 533 μm and a refractive index of the pixels adjacent to the partition wall with respect to light having a wavelength of 1000 nm is 0.30 to 0.80.

Since the solid-state imaging element according to the embodiment of the present invention includes the above-described optical filter, even in a case where light is incident on the pixels of the optical filter from an oblique direction, the light can be efficiently incident on the photoelectric conversion unit, and a difference between a sensitivity to vertically incident light and a sensitivity to obliquely incident light can be reduced. Therefore, it is possible to suppress a variation in incident amount of light between a central portion and a peripheral portion of the photoelectric conversion unit, and it is possible to obtain a solid-state imaging element in which a variation in sensitivity characteristics is suppressed. In the present specification, the thickness of the partition wall means a length of the partition wall in a vertical direction, and the width of the partition wall means a length of the partition wall in a horizontal direction. The same applies to the thickness of the pixels and the width of the pixels. Hereinafter, details of the solid-state imaging element according to the embodiment of the present invention will be described with reference to the drawings.

Figure 2:
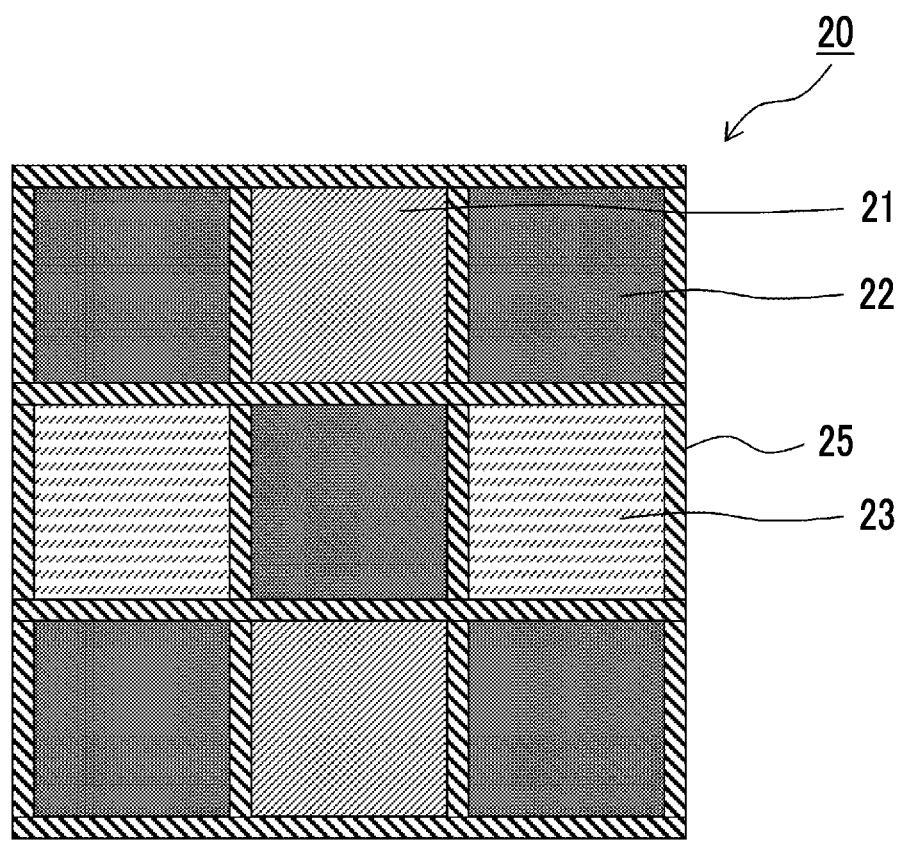
FIG. 2 is a plan view of an optical filter used in the solid-state imaging element of FIG. 1 as viewed from directly above.

FIG. 1 is a side sectional view showing one embodiment of the solid-state imaging element, and FIG. 2 is a plan view of an optical filter used in the solid-state imaging element 100 shown in FIG. 1 as viewed from directly above. The solid-state imaging element 100 shown in FIG. 1 is irradiated with light from the upper side in the drawing.

In FIG. 1, reference 1 is a support. A material of the support 1 is not particularly limited. Examples thereof include a silicon substrate and an InGaAs substrate. In addition, on a surface of the support 1, an underlayer may be formed for improving adhesiveness with upper layer, preventing diffusion of substances, or flattening the surface of the substrate.

The support 1 of the solid-state imaging element 100 shown in FIG. 1 is provided with a photoelectric conversion unit 10. Examples of the photoelectric conversion unit 10 include a silicon photodiode, an InGaAs photodiode, an organic photoelectric conversion film, and a quantum dot. In addition, a gap may be formed between the adjacent photoelectric conversion units 10 of the support 1.

An optical filter 20 is provided on a light incident side of the support 1 with respect to the photoelectric conversion unit 10. Referring to FIG. 2, the optical filter 20 has pixels 21, 22, and 23 arranged in a patterned manner and a partition wall 25 disposed between the pixels. Although FIG. 2 has three kinds of pixels 21, 22, and 23, the optical filter 20 may have two kinds of pixels or four or more kinds of pixels. The number of kinds of pixels and the arrangement of pixels can be appropriately selected according to the intended use and purpose.

Examples of the kinds of pixels included in the optical filter 20 include colored pixels such as red pixels, green pixels, blue pixels, yellow pixels, cyan pixels, and magenta pixels; white pixels; pixels of near-infrared cut filter; and pixels of near-infrared transmitting filter. The optical filter preferably has colored pixels. In addition, it is also preferable that the optical filter includes at least one kind of pixel selected from a yellow pixel, a cyan pixel, or a magenta pixel. According to this aspect, the effects of the present invention can be obtained more remarkably, the sensitivity is higher, and a clearer and brighter image can be obtained. Among these, it is preferable that the optical filter includes the yellow pixel, the cyan pixel, and the magenta pixel.

Examples of the pixel of near-infrared cut filter include a filter layer having a maximal absorption wavelength in a wavelength range of 700 to 1800 nm. As the pixel of near-infrared cut filter, a filter layer having a maximal absorption wavelength in a wavelength range of 700 to 1300 nm is preferable, and a filter layer having a maximal absorption wavelength in a wavelength range of 700 to 1000 nm is more preferable. In addition, in the pixel of near-infrared cut filter, a light transmittance in the entire wavelength range of 400 to 650 nm is preferably 70% or more, more preferably 80% or more, and still more preferably 90% or more. In addition, a transmittance at least one point in a wavelength range of 700 to 1800 inn is preferably 20% or less. In addition, in the pixel of near-infrared cut filter, absorbance Amax/absorbance A550, which is a ratio of an absorbance Amax at a maximal absorption wavelength to an absorbance A550 at a wavelength of 550 nm, is preferably 20 to 500, more preferably 50 to 500, still more preferably 70 to 450, and particularly preferably 100 to 400.

The pixel of near-infrared transmitting filter is a filter layer which transmits at least a part of near-infrared rays. The pixel of near-infrared transmitting filter may be a filter layer (transparent film) which transmits both visible light and near-infrared rays, or may be a filter layer which shields at least a part of visible light and transmits at least a part of near-infrared rays. Preferred examples of the near-infrared transmitting filter layer include filter layers satisfying spectral characteristics in which the maximum value of a transmittance in a wavelength range of 400 to 640 nm is 20% or less (preferably 15% or less and more preferably 10% or less) and the minimum value of a transmittance in a wavelength range of 1100 to 1300 nm is 70% or more (preferably 75% or more and more preferably 80% or more). The pixel of near-infrared transmitting filter is preferably a filter layer which satisfies any one of the following spectral characteristics (1) to (4).

(1): filter layer in which the maximum value of a transmittance in a wavelength range of 400 to 640 nm is 20% or less (preferably 15% or less and more preferably 10% or less) and the minimum value of a transmittance in a wavelength range of 800 to 1300 nm is 70% or more (preferably 75% or more and more preferably 80% or more).

(2): filter layer in which the maximum value of a transmittance in a wavelength range of 400 to 750 nm is 20% or less (preferably 15% or less and more preferably 10% or less) and the minimum value of a transmittance in a wavelength range of 900 to 1300 nm is 70% or more (preferably 75% or more and more preferably 80% or more).

(3): filter layer in which the maximum value of a transmittance in a wavelength range of 400 to 830 nm is 20% or less (preferably 15% or less and more preferably 10% or less) and the minimum value of a transmittance in a wavelength range of 1000 to 1300 nm is 70% or more (preferably 75% or more and more preferably 80% or more).

(4): filter layer in which the maximum value of a transmittance in a wavelength range of 400 to 950 nm is 20% or less (preferably 15% or less and more preferably 10% or less) and the minimum value of a transmittance in a wavelength range of 1100 to 1300 nm is 70% or more (preferably 75% or more and more preferably 80% or more).

The colored pixel can be formed by using a composition for forming a colored pixel, which will be described later. In addition, the white pixel can be formed by using a composition for forming a white pixel, which will be described later. In addition, the pixel of near-infrared cut filter can be formed by using a composition for forming a pixel of near-infrared cut filter, which will be described later. In addition, the pixel of near-infrared transmitting filter can be formed by using a composition for forming a pixel of near-infrared transmitting filter, which will be described later.

A refractive index of the pixels 21, 22, and 23 with respect to light having a wavelength of 1000 nm is 1.60 to 1.90. From the viewpoint of light collecting property of light incident on the pixels, the lower limit of the refractive index of the pixels is preferably 1.63 or more and more preferably 1.65 or more. From the viewpoint of light collecting property of light incident on the pixels, the upper limit of the refractive index of the pixels is preferably 1.80 or less and more preferably 1.75 or less.

A thickness H2 of the pixels 21, 22, and 23 is preferably 300 to 600 nm. The lower limit is preferably 350 nm or more and more preferably 390 nm or more. The upper limit is preferably 550 nm or less and more preferably 510 nm or less. In a case where the thickness H2 of the pixels 21, 22, and 23 are within the above-described range, crosstalk can be easily suppressed.

In addition, a difference in thickness between the pixels is preferably 100 nm or less, more preferably 50 nm or less, and still more preferably 30 nm or less. It is preferable that the thickness of each pixel is the same.

A width W2 of the pixels 21, 22, and 23 is preferably 300 to 1100 nm. The lower limit is preferably 400 nm or more and more preferably 450 nm or more. The upper limit is preferably 1000 nm or less and more preferably 900 nm or less. In a case where the width W2 of the pixels 21, 22, and 23 is within the above-described range, it is possible to reduce the size and increase resolution of the solid-state imaging element.

A surface roughness Ra value of the pixels 21, 22, and 23 is preferably 0.1 to 5.0 nm. The upper limit of the surface roughness Ra value is preferably 4.5 nm or less and more preferably 4.0 nm or less. In a case where the surface roughness Ra value of the pixels 21, 22, and 23 is within the above-described range, it is possible to suppress reflection of light on surfaces of the pixels 21, 22, and 23, and it is easy to take in the light inside the pixels. The surface roughness Ra value of the pixels can be measured by a dynamic force mode method with AFM5500 (manufactured by Hitachi High-Technologies Corporation).

The surfaces of the pixels 21, 22, and 23 are flat in the embodiment shown in FIG. 1, but may be convex.

As shown in FIGS. 1 and 2, the partition wall 25 is disposed between the pixels of the optical filter 20. A refractive index of the partition wall 25 with respect to light having a wavelength of 533 nm is 1.10 to 1.30. From the viewpoint of strength of the partition wall, the lower limit of the refractive index is preferably 1.12 or more and more preferably 1.15 or more. From the viewpoint of light collecting property of light, the upper limit of the refractive index is preferably 1.29 or less and more preferably 1.28 or less.

A width W1 of the partition wall 25 is 80 to 150 nm. From the viewpoint of strength of the partition wall, the lower limit of the width W1 of the partition wall 25 is preferably 90 nm or more, more preferably 100 nm or more, and still more preferably 110 nm or more. From the viewpoint of ensuring an effective pixel size, the upper limit of the width W1 of the partition wall 25 is preferably 140 nm or less and more preferably 130 nm or less.

A thickness H1 of the partition wall 25 is preferably 300 to 650 nm. The lower limit of the thickness H1 of the partition wall 25 is preferably 350 nm or more, more preferably 400 nm or more, and still more preferably 450 nm or more. The upper limit of the thickness H1 of the partition wall 25 is preferably 600 nm or less, more preferably 550 nm or less, and still more preferably 500 nm or less. In a case where the thickness H1 of the partition wall 25 is within the above-described range, the above-described effects of the present invention are easily obtained.

A difference between the thickness H1 of the partition wall 25 and the thickness H2 of the pixel 21 (22 and 23) adjacent to the partition wall 25 is 200 nm or less, preferably 150 nm or less, more preferably 100 nm or less, and still more preferably 50 nm or less. In a case where the difference in thickness between the two is 200 nm or less, even in a case where light is incident on the pixels from an oblique direction, light leak to adjacent pixels can be effectively suppressed.

In the embodiment shown in FIG. 1, the thickness H1 of the partition wall 25 and the thickness H2 of the pixel 21 (22 and 23) adjacent to the partition wall 25 are substantially the same, and the difference in thickness between the two is almost 0. However, the difference between the thickness H1 of the partition wall 25 and the thickness H2 of the pixel 21 (22 and 23) adjacent to the partition wall 25 may be 1 nm or more, or 3 nm or more.

In a case where the thickness of the partition wall and the thickness of the pixels are the same, that is, a case where an upper surface of the partition wall and an upper surface of the pixels are aligned, formability of a microlens formed on the upper portion can be enhanced.

In a case where the thickness of the partition wall is smaller than the thickness of the pixels, that is, a case where the upper surface of the partition wall is located below the upper surface of the pixels, coating properties of a composition for forming the pixel is good, and coating unevenness of the composition for forming the pixel can be suppressed.

In a case where the thickness of the partition wall is larger than the thickness of the pixels, that is, a case where the upper surface of the partition wall is located above the upper surface of the pixels, even in a case where light is incident on the pixels from an oblique direction, light leak to adjacent pixels can be more effectively suppressed.

A difference between the refractive index of the partition wall 25 with respect to light having a wavelength of 533 nm and the refractive index of the pixel 21 (22 and 23) adjacent to the partition wall 25 with respect to light having a wavelength of 1000 nm is 0.30 to 0.80. From the reason of suppressing crosstalk, the lower limit of the difference in refractive index described above is preferably 0.40 or more and more preferably 0.50 or more. The upper limit of the difference in refractive index described above is preferably 0.75 or less and more preferably 0.70 or less.

A void ratio of the partition wall 25 is preferably 20% to 80%. The lower limit of the void ratio is preferably 30% or more and more preferably 40% or more. The upper limit of the void ratio is preferably 70% or less and more preferably 60% or less. In a case where the void ratio of the partition wall 25 is within the above-described range, even in a case where light is incident on the pixels from an oblique direction, light leak to adjacent pixels can be effectively suppressed. The void ratio of the partition wall is a value measured by an X-ray reflectivity method.

A material of the partition wall 25 is not particularly limited. Examples thereof include organic materials such as siloxane resin and fluororesin, and inorganic particles such as silica particles and magnesium fluoride. From the reason that it is possible to increase the strength of the partition wall, the partition wall 25 preferably includes silica particles.

Examples of the silica particles include silica particles (hereinafter, also referred to as a beaded silica) having a shape in which a plurality of spherical silica particles are linked in a beaded shape, and silica particles (hereinafter, also referred to as a hollow silica) having a hollow structure, and a beaded silica is preferable. In addition, in the silica particles, it is also preferable that at least a part of hydroxy groups on a surface of the silica particles is treated with a hydrophobizing treatment agent which reacts with the hydroxy groups. As the hydrophobizing treatment agent, a compound having a structure which reacts with the hydroxy group on the surface of the silica particles (preferably, a structure which reacts with the hydroxy group on the surface of the silica particles by coupling) so as to improve hydrophobicity of the silica particles is used. The hydrophobizing treatment agent is preferably an organic compound. Specific examples of the hydrophobizing treatment agent include an organosilane compound, an organotitanium compound, an organozirconium compound, and an organoaluminum compound, and from the reason that increase in refractive index can be suppressed, an organosilane compound is more preferable. In the present specification, the "spherical" means that the particle may be substantially spherical and may be deformed within a range in which the effect of the present invention is exhibited. For example, the "spherical" is meant to include a shape having roughness on the surface, and a flat surface having a long axis in a predetermined direction. In addition, the "a plurality of spherical silica particles are linked in a beaded shape" means a structure in which a plurality of spherical silica particles are linked in a linear and/or branched form. Examples thereof include a structure in which a plurality of spherical silica particles are linked by a joint having a smaller outer diameter. In addition, in the present invention, the structure in which "a plurality of spherical silica particles are linked in a beaded shape" includes not only a ring-shaped structure, but also a chain-shaped structure with ends.

In the beaded silica, a ratio $D_1/D_2$ of an average particle diameter $D_1$ measured by a dynamic light scattering method and an average particle diameter $D_2$ obtained by the following expression (1) is preferably 3 or more. The upper limit of $D_1/D_2$ is not particularly limited, but is preferably 1000 or less, more preferably 800 or less, and still more preferably 500 or less. By setting $D_1/D_2$ within such a range, good optical characteristics can be exhibited. The value of $D_1/D_2$ in the beaded silica is also an indicator of a degree of connection of the spherical silica.

$$D_2 = 2720/S \qquad (1)$$

In the expression, $D_2$ is an average particle diameter of the beaded silica, in units of nm, and S is a specific surface area of the beaded silica measured by a nitrogen adsorption method, in units of $m^2/g$.

The above-described average particle diameter $D_2$ of the beaded silica can be regarded as an average particle diameter close to a diameter of primary particles of the spherical silica. The average particle diameter $D_2$ is preferably 1 nm or more, more preferably 3 nm or more, still more preferably 5 nm or more, and particularly preferably 7 nm or more. The upper limit is preferably 100 nm or less, more preferably 80 nm or less, still more preferably 70 nm or less, even more preferably 60 nm or less, and particularly preferably 50 nm or less.

The average particle diameter $D_2$ can be replaced by a circle-equivalent diameter (D0) in a projection image of the spherical portion measured by a transmission electron microscope (TEM). Unless otherwise specified, the average particle diameter based on the circle-equivalent diameter is evaluated by the number average of 50 or more particles.

The above-described average particle diameter $D_1$ of the beaded silica can be regarded as a number average particle diameter of secondary particles in which a plurality of spherical silicas are collected. Therefore, a relationship of $D_1 > D_2$ is usually satisfied. The average particle diameter $D_1$ is preferably 5 nm or more, more preferably 7 nm or more, and particularly preferably 10 nm or more. The upper limit is preferably 100 nm or less, more preferably 70 nm or less, still more preferably 50 nm or less, and particularly preferably 45 nm or less.

Unless otherwise specified, the above-described average particle diameter $D_1$ of the beaded silica is measured using a dynamic light scattering type particle size distribution measuring device (Microtrac UPA-EX150, manufactured by Nikkiso Co., Ltd.). The procedure is as follows. A dispersion liquid of the beaded silica is divided into 20 ml sample bottles, and diluted with propylene glycol monomethyl ether so that the concentration of solid contents is 0.2 mass %. The diluted sample solution is irradiated with 40 kHz ultrasonic waves for 1 minute, and immediately after that, the sample solution is used for test. Data is captured 10 times using a 2 ml quartz cell for measurement at a temperature of 25° C., and the obtained "number average" is regarded as the average particle diameter. For other detailed conditions and the like, the description of "Particle size analysis—Dynamic light scattering method" in JIS Z8828:2013 can be referred to as necessary. Five samples are produced for each level and the average value thereof is adopted.

As the beaded silica, it is preferable that a plurality of spherical silicas having an average particle diameter of 1 to 80 nm are linked through a linking material. The upper limit of the average particle diameter of the spherical silica is preferably 70 nm or less, more preferably 60 nm or less, and still more preferably 50 nm or less. In addition, the lower limit of the average particle diameter of the spherical silica is preferably 3 nm or more, more preferably 5 nm or more, and still more preferably 7 nm or more. In the present invention, as the value of the average particle diameter of the spherical silica, a value of an average particle diameter obtained from the circle-equivalent diameter in the projection image of the spherical portion measured by a transmission electron microscope (TEM) is used.

In the beaded silica, examples of the linking material for linking the spherical silicas include metal oxide-containing silica. Examples of the metal oxide include an oxide of metal selected from Ca, Mg, Sr, Ba, Zn, Sn, Pb, Ni, Co, Fe, Al, In, Y, and Ti. Examples of the metal oxide-containing silica include a reaction product and a mixture of these metal oxides and silica ($SiO_2$). With regard to the linking material, reference can be made to the description in WO2000/015552A, the content of which is incorporated herein by reference.

The number of linked spherical silicas in the beaded silica is preferably 3 or more and more preferably 5 or more. The upper limit is preferably 1000 or less, more preferably 800 or less, and still more preferably 500 or less. The number of linked spherical silicas can be measured by TEM.

Examples of a commercially available product of a particle solution including the beaded silica include SNOW-TEX series and ORGANOSILICASOL series (methanol dispersion liquid, isopropyl alcohol dispersion liquid, ethylene glycol dispersion liquid, methyl ethyl ketone dispersion liquid, and the like; product numbers: IPA-ST-UP, MEK-ST-UP, and the like) manufactured by Nissan Chemical Corporation. In addition, as the particle solution including the beaded silica, for example, a silica sol described in JP4328935B can be used.

An average particle diameter of the hollow silica is preferably 10 to 500 nm. The lower limit is preferably 15 nm or more, more preferably 20 nm or more, and still more preferably 25 urn or more. The upper limit is preferably 300 nm or less, more preferably 200 nm or less, and still more preferably 100 nm or less. The average particle diameter of the hollow silica is a value measured by a dynamic light scattering method. Examples of a commercially available product of a particle solution including the hollow silica include "THRULYA 4110" (manufactured by JGC C&C).

The partition wall 25 can be formed by using a known method in the related art. For example, the partition wall can be formed as follows. First, a partition wall material layer is formed on the support. The partition wall material layer can be formed, for example, by applying a composition (composition for a partition wall) including inorganic particles such as silica particles to the support, and then curing the composition. Examples of such a composition include compositions described in paragraph Nos. 0012 to 0077 and 0093 to 0105 of WO2019/017280A and compositions described in paragraph No. 0079 of WO2019/111748A, the contents of which are incorporated herein by reference. In addition, the partition wall material layer can be formed by forming a film formed of an inorganic material such as silicon dioxide on the support by a vapor deposition method such as a chemical vapor deposition (CVD) and a vacuum vapor deposition, or a method such as sputtering. Next, using a mask having a pattern which follows the shape of the partition wall, a resist pattern is formed on the partition wall material layer. Next, using the resist pattern as a mask, the partition wall material layer is etched to form a pattern. Examples of the etching method include a dry etching method and a wet etching method. Etching by the dry etching method can be performed under conditions described in paragraph Nos. 0128 to 0133 of JP2016-014856A. Next, the resist pattern is peeled off from the partition wall material layer. In this way, the partition wall can be formed.

In addition, although not shown, an underlayer may be provided at a boundary 25a between the partition wall 25 and the pixels 21, 22, and 23. By providing the underlayer, adhesiveness between the pixels and the partition wall can be improved. Furthermore, it is possible to suppress diffusion of components in the pixels into the partition wall, thereby increasing the strength of the partition wall. As a material of the underlayer, various inorganic materials and organic materials can be used. Examples of the organic material include acrylic resin, polystyrene resin, polyimide resin, and organic spin on glass (SOG) resin. In addition, the underlayer can also be formed using a composition including a compound having an ethylenically unsaturated bond-containing group. In addition, the underlayer can also be formed using an organosilane compound such as 1,1,1,3,3, 3-hexamethyldisilazane. Examples of the ethylenically unsaturated bond-containing group include a vinyl group, a (meth)allyl group, a (meth)acryloyl group, and styryl group, and a (meth)allyl group or a (meth)acryloyl group is preferable. The compound having an ethylenically unsaturated bond-containing group may be a monomer or a resin such as a polymer. Examples of the inorganic material include silicon dioxide and aluminum oxide. The underlayer can be formed by using a known method in the related art. In a case of forming an underlayer formed of an organic material, for example, the underlayer can be formed by applying a composition (composition for an underlayer) including the organic material to the partition wall and drying the composition. In a case of forming an underlayer formed of an inorganic material, for example, the underlayer can be formed by forming a film formed of the inorganic material forming the underlayer on the surface of the partition wall by a vapor deposition method such as a chemical vapor deposition (CVD) and a vacuum vapor deposition, or a method such as sputtering.

A pixel pitch P1 of the optical filter 20 is preferably 400 to 1200 nm. The lower limit of the pixel pitch P1 is preferably 450 nm or more and more preferably 500 nm or more. The upper limit of the pixel pitch P1 is preferably 1000 nm or less, more preferably 900 nm or less, and still more preferably 800 nm or less. In the present specification, the pixel pitch is a total value of the width of the partition wall and the width of the pixel located on one side surface side of the partition wall. In addition, in a case where the underlayer is present between the partition wall and the pixel, the value includes the width of the underlayer. As the pixel pitch is narrower, sensitivity to incident light from an oblique direction tends to decrease. However, with the solid-state imaging element according to the embodiment of the present invention, since the pixels and the partition wall each satisfy the above-described dimensional relationship, it is possible to suppress a decrease in sensitivity to incident light from an oblique direction even in a case where the pixel pitch is within the above-described range. Therefore, in the solid-state imaging element according to the embodiment of the present invention, a particularly remarkable effect can be obtained in a case where the optical filter 20 having a narrow pixel pitch is used.

In the solid-state imaging element shown in FIG. 1, a microlens 30 is provided on a surface of the optical filter 20 on the light incident side. Although not shown, a planarizing layer may be provided between the microlens 30 and the optical filter 20. In addition, a shape of the microlens 30 shown in FIG. 1 is a semicircular lens shape, but the shape is not particularly limited, and a trapezoidal lens or a lens having a shape described in JP2014-029524A can also be used.

A refractive index of the microlens 30 with respect to light having a wavelength of 550 nm is preferably 1.50 to 1.80. The upper limit of the refractive index is preferably 1.75 or less and more preferably 1.70 or less. In addition, the lower limit of the refractive index is preferably 1.55 or more and more preferably 1.58 or more. In addition, a minimum transmittance of the microlens 30 with respect to light having a wavelength of 400 to 700 nm is preferably 90% or more and more preferably 95% or more. In addition, the microlens may include a near-infrared absorber. Examples of the near-infrared absorber include those described later.

In addition, in the solid-state imaging element shown in FIG. 1, the microlens 30 is provided on the surface of the optical filter 20, but in the solid-state imaging element according to the embodiment of the present invention, the microlens 30 can be omitted.

An imaging apparatus including the solid-state imaging element according to the embodiment of the present invention can also be used as a vehicle camera or a surveillance camera, in addition to a digital camera or electronic apparatus (mobile phones or the like) having an imaging function.

<Composition for Forming Colored Pixel>

Next, a composition for forming a colored pixel, which is preferably used for forming a colored pixel of the optical filter, will be described. The composition for forming a colored pixel preferably contains a chromatic colorant. Examples of the chromatic colorant include chromatic colorants such as a red colorant, a green colorant, a blue colorant, a yellow colorant, a violet colorant, and an orange colorant. The chromatic colorant may be a pigment or a dye. The pigment and the dye may be used in combination. Examples of the pigment include the following pigments:

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228, 231, 232 (methine-based), 233 (quinoline-based), 234 (aminoketone-based), 235 (aminoketone-based), 236 (aminoketone-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 269, 270, 272, 279, 291, 294 (xanthene-based, Organo Ultramarine, Bluish Red), 295 (monoazo-based), 296 (diazo-based), 297 (aminoketone-based), and the like (all of which are red pigments);

C. I. Pigment Green 7, 10, 36, 37, 58, 59, 62, 63, 64 (phthalocyanine-based), 65 (phthalocyanine-based), 66 (phthalocyanine-based), and the like (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green colorant. Specific examples thereof include the compounds described in WO2015/118720A. In addition, as the green colorant, a compound described in CN2010-6909027A, a phthalocyanine compound described in WO2012/102395A, which has phosphoric acid ester as a ligand, a phthalocyanine compound described in JP2019-008014A, a phthalocyanine compound described in JP2018-180023A, a compound described in JP2019-038958A, and the like can also be used.

In addition, as the blue colorant, an aluminum phthalocyanine compound having a phosphorus atom can also be used. Specific examples thereof include the compounds described in paragraph Nos. 0022 to 0030 of JP2012-247591A and paragraph No. 0047 of JP2011-157478A.

In addition, as the yellow colorant, compounds described in JP2017-201003A, compounds described in JP2017-197719A, compounds described in paragraph Nos. 0011 to 0062 and 0137 to 0276 of JP2017-171912A, compounds described in paragraph Nos. 0010 to 0062 and 0138 to 0295 of JP2017-171913A, compounds described in paragraph Nos. 0011 to 0062 and 0139 to 0190 of JP2017-171914A, compounds described in paragraph Nos. 0010 to 0065 and 0142 to 0222 of JP2017-171915A, quinophthalone compounds described in paragraph Nos. 0011 to 0034 of JP2013-054339A, quinophthalone compounds described in paragraph Nos. 0013 to 0058 of JP2014-026228A, isoindoline compounds described JP2018-062644A, quinophthalone compounds described in JP2018-203798A, quinophthalone compounds described in JP2018-062578A, quinophthalone compounds described in JP6432076B, quinophthalone compounds described in JP2018-155881A, quinophthalone compounds described in JP2018-111757A, quinophthalone compounds described in JP2018-040835A, quinophthalone compounds described in JP2017-197640A, quinophthalone compounds described in JP2016-145282A, quinophthalone compounds described in JP2014-085565A, quinophthalone compounds described in JP2014-021139A, quinophthalone compounds described in JP2013-209614A, quinophthalone compounds described in JP2013-209435A, quinophthalone compounds described in JP2013-181015A, quinophthalone compounds described in JP2013-061622A, quinophthalone compounds described in JP2013-032486A, quinophthalone compounds described in JP2012-226110A, quinophthalone compounds described in JP2008-074987A, quinophthalone compounds described in JP2008-081565A, quinophthalone compounds described in JP2008-074986A, quinophthalone compounds described in JP2008-074985A, quinophthalone compounds described in JP2008-050420A, quinophthalone compounds described in JP2008-031281A, quinophthalone compounds described in JP1973-032765A (JP-S48-032765A), quinophthalone compounds described in JP2019-008014A, quinophthalone compounds described in JP6607427B, methine dyes described in JP2019-073695A, methine dyes described in JP2019-073696A, methine dyes described in JP2019-073697A, methine dyes described in JP2019-073698A, and the like can also be used. In addition, from the viewpoint of improving color value, a multimerized compound of these compounds is also preferably used. In addition, as the yellow colorant, from the viewpoint of improving resistance, it is also preferable to use C. I. Pigment. Yellow 129 or C. I. Pigment Yellow 215.

In addition, a coloring agent multimer can also be used as the chromatic colorant. The coloring, agent multimer is preferably a dye which is used after being dissolved in a solvent. In addition, the coloring agent multimer may form a particle. In a case where the coloring agent multimer is a particle, the coloring agent multimer is usually used in a state of being dispersed in a solvent. The coloring agent multimer in the particle state can be obtained by, for example, emulsion polymerization, and specific examples thereof include the compounds and production methods described in JP2015-214682A. The coloring agent multimer has two or more coloring agent structures in one molecule, and preferably has three or more coloring agent structures in one molecule. The upper limit is particularly not limited, but may be 100 or less. A plurality of coloring agent structures included in one molecule may be the same coloring agent structure or different coloring agent structures. The weight-average molecular weight (Mw) of the coloring agent multimer is preferably 2000 to 50000. The lower limit is more preferably 3000 or more and still more preferably 6000 or more. The upper limit is more preferably 30000 or less and still more preferably 20000 or less. As the coloring agent multimer, the compounds described in JP2011-213925A, JP2013-041097A, JP2015-028144A, JP2015-030742A, WO2016/031442A, or the like can also be used.

The content of the chromatic colorant in the total solid content of the composition for forming a colored pixel is preferably 10 mass % or more, more preferably 15 mass % or more, still more preferably 20 mass % or more, and particularly preferably 40 mass % or more. The upper limit is preferably 80 mass % or less and more preferably 75 mass % or less.

The composition for forming a colored pixel can further contain a pigment derivative. Examples of the pigment derivative include a compound having a structure in which a part of a chromophore is substituted with an acid group, a basic group, or a phthalimidomethyl group. Examples of the chromophore constituting the pigment derivative include a quinoline skeleton, a benzimidazolone skeleton, a diketopyrrolopyrrole skeleton, an azo skeleton, a phthalocyanine skeleton, an anthraquinone skeleton, a quinacridone skeleton, a dioxazine skeleton, a perinone skeleton, a perylene skeleton, a thioindigo skeleton, an isoindoline skeleton, an isoindolinone skeleton, a quinophthalone skeleton, a threne skeleton, and a metal complex skeleton. Among these, a quinoline skeleton, a benzimidazolone skeleton, a diketopyrrolopyrrole skeleton, an azo skeleton, a quinophthalone skeleton, an isoindoline skeleton, or a phthalocyanine skeleton is preferable, and an azo skeleton or a benzimidazolone skeleton is more preferable. As the acid group included in the pigment derivative, a sulfo group or a carboxyl group is preferable and a sulfo group is more preferable. As the basic group included in the pigment derivative, an amino group is preferable and a tertiary amino group is more preferable. In addition, as the pigment derivative, a pigment derivative having excellent visible transparency (hereinafter, also referred to as a transparent pigment derivative) can be contained. The maximum value (εmax) of the molar absorption coefficient of the transparent pigment derivative in a wavelength range of 400 to 700 nm is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less. The lower limit of εmax is, for example, 1 $L \cdot mol^{-1} \cdot cm^{-1}$ or more and may be 10 $L \cdot mol^{-1} \cdot cm^{-1}$ or more.

Specific examples of the pigment derivative include compounds described in Example described later and compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraph Nos. 0086 to 0098 of WO2011/024896A, paragraph Nos. 0063 to 0094 of WO2012/102399 A, paragraph No. 0082 of WO2017/038252A, paragraph No. 0171 of JP2015-151530A, paragraph Nos. 0162 to 0183 of JP2011-252065A, JP2003-081972A, JP5299151B, JP2015-172732A, JP2014-199308A, JP2014-085562A, JP2014-035351A, JP2008-081565A, and JP2019-109512A.

The content of the pigment derivative is preferably 1 to 30 parts by mass and still more preferably 3 to 20 parts by mass with respect to 100 parts by mass of the pigment. The pigment derivative may be used singly or in combination of two or more kinds thereof.

The composition for forming a colored pixel can contain a polymerizable compound. The polymerizable compound is preferably, for example, a compound having an ethylenically unsaturated bond-containing group. Examples of the ethylenically unsaturated bond-containing group include a vinyl group, a (meth)allyl group, and a (meth)acryloyl group. The polymerizable compound is preferably a radically polymerizable compound. Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less and still more preferably 1500 or less. The lower limit is more preferably 150 or more and still more preferably 250 or more. The polymerizable compound is preferably a compound including 3 or more ethylenically unsaturated bond-containing groups, more preferably a compound including 3 to 15 ethylenically unsaturated bond-containing groups, and still more preferably a compound including 3 to 6 ethylenically unsaturated bond-containing groups. In addition, the radically polymerizable compound is preferably a trifunctional to pentadecafunctional (meth)acrylate compound and more preferably a trifunctional to hexafunctional (meth)acrylate compound. Specific examples of the radically polymerizable compound include the compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of JP2013-253224A, paragraph No. 0477 of JP2012-208494A, JP2017-048367A, JP6057891B, JP6031807B, and JP2017-194662A, the contents of which are incorporated herein by reference. As the radically polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer) is preferable.

The content of the polymerizable compound in the total solid content of the composition for forming a colored pixel is preferably 0.1 to 50 mass %. The lower limit is more preferably 0.5 mass % or more and still more preferably 1 mass % or more. The upper limit is more preferably 45 mass % or less and still more preferably 40 mass % or less. The polymerizable compound may be used singly or in combination of two or more kinds thereof.

The composition for forming a colored pixel can contain a photopolymerization initiator. The photopolymerization initiator is not particularly limited, and can be appropriately selected from known photopolymerization initiators. For example, a compound having photosensitivity to rays in a range from an ultraviolet range to a visible range is preferable. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. In addition, as the photopolymerization initiator, compounds described in paragraphs 0065 to 0111 of JP2014-130173A, compounds described in JP6301489B, peroxide-based photopolymerization initiators described in MATERIAL STAGE, p. 37 to 60, vol. 19, No. 3, 2019, photopolymerization initiators described in WO2018/221177A, photopolymerization initiators described in WO2018/110179A, photopolymerization initiators described in JP2019-043864A, and photopolymerization initiators described in JP2019-044030A, the contents of which are incorporated herein by reference.

Examples of a commercially available product of the α-hydroxyketone compound include Omnirad 184, Omnirad 1173, Omnirad 2959, and Omnirad 127 (all of which are manufactured by IGM Resins B.V.), Irgacure 184, Irgacure 1173, Irgacure 2959, and Irgacure 127 (all of which are manufactured by BASF). Examples of a commercially available product of the α-aminoketone compound include Omnirad 907, Omnirad 369, Omnirad 369E, and Omnirad 379EG (all of which are manufactured by IGM Resins B.V.), Irgacure 907, Irgacure 369, Irgacure 369E, and Irgacure 379EG (all of which are manufactured by BASF). Examples of a commercially available product of the acylphosphine compound include Omnirad 819 and Omnirad TPO (both of which are manufactured by IGM Resins B.V.), and Irgacure 819 and Irgacure TPO (both of which are manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, and the compounds described in WO2013/167515A. Specific examples of the oxime compound include 3-benzoyloxyiminobutane-2-one, 3-acetoxyiminobutane-2-one, 3-propionyloxyiminobutane-2-on e, 2-acetoxyiminopentane-3-one, 2-acetoxyimino-1-phenyl-propane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

Examples of a commercially available product thereof include Irgacure OXE01, Irgacure OXE02, Irgacure OXE03, and Irgacure OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product include ADEKA ARKLS NCI-730, NCI-831, and NCI-930 (all of which are manufactured by ADEKA Corporation).

An oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A.

The content of the photopolymerization initiator in the total solid content of the composition for forming a colored pixel is preferably 0.1 to 30 mass %. The lower limit is preferably 0.5 mass % or more and more preferably 1 mass % or more. The upper limit is preferably 20 mass % or less and more preferably 15 mass % or less. The photopolymerization initiator may be used singly or in combination of two or more kinds thereof.

The composition for forming a colored pixel can contain a resin. The resin is blended in, for example, an application for dispersing, particles such as a pigment in a composition for forming a colored pixel or an application as a binder. Mainly, a resin which is used for dispersing particles such as a pigment is also referred to as a dispersant. However, such applications of the resin are only exemplary, and the resin can also be used for other purposes in addition to such applications. The weight-average molecular weight (Mw) of the resin is preferably 3000 to 2000000. The upper limit is more preferably 1000000 or less and still more preferably 500000 or less. The lower limit is more preferably 4000 or more and still more preferably 5000 or more. Examples of the resin include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. These resins may be used singly or as a mixture of two or more kinds thereof. In addition, resins described in paragraph Nos. 0041 to 0060 of JP2017-206689A, resins described in paragraph Nos. 0022 to 0071 of JP2018-010856A, resins described in JP2017-057265A, resins described in JP2017-032685A, resins described in JP2017-075248A, and resins described in JP2017-066240A can also be used.

As the resin, it is preferable to use a resin having an acid group. According to this aspect, developability of the composition for forming a colored pixel can be further improved. Examples of the acid group include a carboxy group, a phosphoric acid group, a sulfo group, and a phenolic hydroxy group, and a carboxy group is preferable. The resin having an acid group can be used, for example, as an alkali-soluble resin. The resin having an acid group preferably includes a repeating unit having an acid group in the side chain, and more preferably includes 5 to 70 mol % of repeating units having an acid group in the side chain with respect to the total repeating units of the resin. The upper limit of the content of the repeating unit having an acid group in the side chain is still more preferably 50 mol % or less and particularly preferably 30 mol % or less. The lower limit of the content of the repeating unit having an acid group in the side chain is still more preferably 10 mol % or more and particularly preferably 20 mol % or more. With regard to the resin having an acid group, reference can be made to the description in paragraph Nos. 0558 to 0571 of JP2012-208494A (paragraph Nos. 0685 to 0700 of the corresponding US2012/0235099A) and the description in paragraph Nos. 0076 to 0099 of JP2012-198408A, the contents of which are incorporated herein by reference. A commercially available product can also be used as the resin having an acid group.

The composition for forming a colored pixel can also include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total amount of the acid group and the basic group is 100 mol %, and more preferably a resin substantially consisting of only an acid group. The acid group included in the acidic dispersant (acidic resin) is preferably a carboxyl group. The acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group. In addition, it is also preferable that the resin used as a dispersant is a graft resin. Examples of the graft resin include resins described in paragraph Nos. 0025 to 0094 of JP2012-255128A, the contents of which are incorporated herein by reference. In addition, it is also preferable that the resin used as a dispersant is a polyimine-based dispersant including a nitrogen atom in at least one of the main chain or the side chain. As the polyimine-based dispersant, a resin having a main chain which has a partial structure having a functional group of pKa 14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. Examples of the polyimine-based dispersant include resins described in paragraph Nos. 0102 to 0166 of JP2012-255128A, the contents of which are incorporated herein by reference. In addition, it is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A. In addition, it is also preferable that the resin used as a dispersant is a resin including a repeating unit having an ethylenically unsaturated bond-containing group in the side chain. The content of the repeating unit having an ethylenically unsaturated bond-containing group in the side chain is preferably 10 mol % or more, more preferably 10 to 80 mol %, and still more preferably 20 to 70 mol % with respect to the total repeating units of the resin. A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. In addition, pigment dispersants described in paragraph Nos. 0041 to 0130 of JP2014-130338A can also be used, the contents of which are incorporated herein by reference. The resin described as a dispersant can be used for an application other than the dispersant. For example, the resin can also be used as a binder.

In a case where the composition for forming a colored pixel includes a resin, the content of the resin in the total solid content of the composition for forming a colored pixel is preferably 5 to 50 mass %. The lower limit is more preferably 10 mass % or more and still more preferably 15 mass % or more. The upper limit is more preferably 40 mass % or less, still more preferably 35 mass % or less, and particularly preferably 30 mass % or less.

The composition for forming a colored pixel can contain a compound having a cyclic ether group. Examples of the cyclic ether group include an epoxy group and an oxetanyl group. It is preferable that the compound having a cyclic ether group is a compound having an epoxy group (hereinafter, also referred to as "epoxy compound"). Examples of the epoxy compound include a compound having one or more epoxy groups in one molecule, and a compound having two or more epoxy groups in one molecule is preferable. It is preferable that the epoxy compound is a compound having 1 to 100 epoxy groups in one molecule. The upper limit of the number of epoxy groups may be, for example, 10 or less or 5 or less. The lower limit of the number of epoxy groups is preferably 2 or more. As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A, and the compounds described in JP2017-179172A can also be used. The contents of the publications are incorporated herein by reference. Examples of a commercially available product of the compound having a cyclic ether group include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, and G-01758 (all of which are manufactured by NOF Corporation, an epoxy group-containing polymer). In a case where the composition for forming a colored pixel contains a compound having a cyclic ether group, the content of the compound having a cyclic ether group in the total solid content of the composition for forming a colored pixel is preferably 0.1 to 20 mass %. The lower limit is, for example, more preferably 0.5 mass % or more and still more preferably 1 mass % or more. The upper limit is, for example, more preferably 15 mass % or less and still more preferably 10 mass % or less. The compound having a cyclic ether group may be used singly or in combination of two or more kinds thereof.

The composition for forming a colored pixel can contain a silane coupling agent. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference. The content of the silane coupling agent in the total solid content of the composition for forming a colored pixel is preferably 0.1 to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof.

The composition for forming a colored pixel can contain a surfactant. As the surfactant, various surfactants such as a fluorine-based surfactant, a nonionic surfactant, a cationic surfactant, an anionic surfactant, and a silicon-based surfactant can be used. Examples of the surfactant include surfactants described in paragraph Nos. 0238 to 0245 of WO2015/166779A, the contents of which are incorporated herein by reference. It is preferable that the surfactant is a fluorine-based surfactant. Examples of the fluorine-based surfactant include surfactants described in paragraph Nos. 0060 to 0064 of JP2014-041318A (paragraph Nos 0060 to 0064 of the corresponding WO2014/017669A) and the like, and surfactants described in paragraph Nos 0117 to 0132 of JP2011-132503A, the contents of which are incorporated herein by reference. In addition, fluorine-containing surfactants described in paragraph Nos. 0016 to 0037 of JP2010-032698A, or the following compounds are also exemplified as the fluorine-based surfactant used in the present invention.

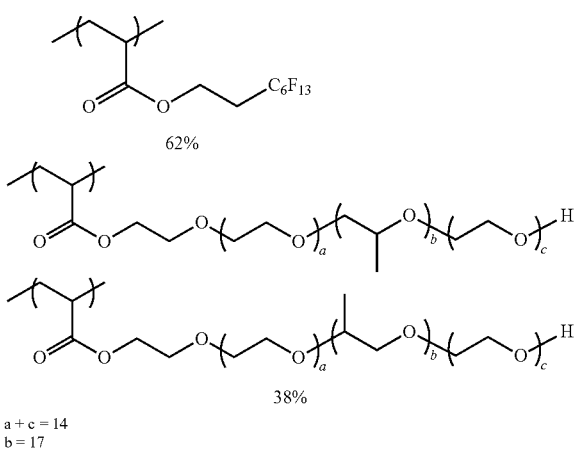

a + c = 14
b = 17

The weight-average molecular weight of the above-described compound is preferably 3000 to 50000 and, for example, 14000. In the above-described compound, "%" indicating the proportion of a repeating unit is mol %.

The content of the surfactant in the total solid content of the composition for forming a colored pixel is preferably 0.001 mass % to 5.0 mass % and more preferably 0.005 to 3.0 mass %. The surfactant may be used singly or in combination of two or more kinds thereof.

The composition for forming a colored pixel can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. Examples of such a compound include compounds described in paragraph Nos. 0038 to 0052 of JP2009-217221A, paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. Examples of a commercially available product of the ultraviolet absorber include UV-503 (manufactured by Daito Chemical Co., Ltd.). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraph Nos. 0049 to 0059 of JP6268967B can also be used. The content of the ultraviolet absorber in the total solid content of the composition for forming a colored pixel is preferably 0.01 to 10 mass % and more preferably 0.01 to 5 mass %. In the present invention, the ultraviolet absorber may be used singly or in combination of two or more kinds thereof.

The composition for forming a colored pixel preferably contains an organic solvent. Basically, the organic solvent is not particularly limited as long as it satisfies solubility of the respective components and coating properties of the composition for forming a colored pixel. Examples of the organic solvent include an ester-based solvent, a ketone-based solvent, an alcohol-based solvent, an amide-based solvent, an ether-based solvent, and a hydrocarbon-based solvent. With regard to details thereof, reference can be made to solvents described in paragraph No. 0223 of WO2015/166779A, the contents of which are incorporated herein by reference. In addition, an ester solvent in which a cyclic alkyl group is substituted or a ketone solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like. The content of the organic solvent in the composition for forming a colored pixel is preferably 10 to 95 mass %, more preferably 20 to 90 mass %, and still more preferably 30 to 90 mass %.

Optionally, the composition for forming a colored pixel may further contain a sensitizer, a curing accelerator, a filler, a thermal curing accelerator, a plasticizer, and other auxiliary agents (for example, conductive particles, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference. In addition, optionally, the composition for forming a colored pixel may contain a potential antioxidant. Examples of the potential antioxidant include a compound in which a site functioning as an antioxidant is protected by a protective group, and the protective group is eliminated by heating the compound at 100° C. to 250° C. or heating the compound at 80° C. to 200° C. in the presence of an acid or base catalyst so that the compound functions as an antioxidant. Examples of the potential antioxidant include compounds described in WO2014/021023A, WO2017/030005A, and JP2017-008219A. Examples of a commercially available product of the potential antioxidant include ADEKA ARKLS GPA-5001 (manufactured by ADEKA Corporation).

<Composition for Forming White Pixel>

Next, a composition for forming a white pixel, which is preferably used for forming a white pixel of the optical filter, will be described. The composition for forming a white pixel preferably contains a white pigment. In the present invention, the white pigment includes not only a pure white pigment but also a bright gray (for example, grayish-white, light gray, and the like) pigment close to white. Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, as the white pigment, the titanium oxide described in "Titanium Oxide-Physical Properties and Applied Technology, written by Manabu Kiyono, pages 13 to 45, published on Jun. 25, 1991, published by Gihodo Shuppan Co., Ltd." can also be used. The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic fine nanoparticles. With regard to the core-shell composite particle composed of a core particle formed of polymer particles and a shell layer formed of inorganic fine nanoparticles, reference can be made to, for example, the descriptions in paragraph Nos. 0012 to 0042 of JP2015-047520A, the contents of which are incorporated herein by reference. As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

The content of the white pigment in the total solid content of the composition for forming a white pixel is preferably 10 mass % or more, more preferably 15 mass % or more, still more preferably 20 mass % or more, and particularly preferably 30 mass % or more. The upper limit is preferably 80 mass % or less, more preferably 70 mass % or less, still more preferably 65 mass % or less, and particularly preferably 60 mass % or less.

The composition for forming a white pixel can further contain a polymerizable compound, a photopolymerization initiator, a resin, a compound having a cyclic ether group, a silane coupling agent, a surfactant, an ultraviolet absorber, an organic solvent, or the like. The preferred range and contents of these materials are the same as the materials and contents described in the above-described composition for forming a colored pixel.

<Composition for Forming Pixel of Near-Infrared Cut Filter>

Next, a composition for forming a pixel of near-infrared cut filter, which is preferably used for forming the pixel of a near-infrared cut filter of the optical filter, will be described. The composition for forming a pixel of near-infrared cut filter preferably contains a near-infrared absorber. The near-infrared absorber is preferably a compound having a maximal absorption wavelength on a wavelength side longer than a wavelength of 700 nm. The near-infrared absorber is preferably a compound having a maximal absorption wavelength in a wavelength range of more than 700 nm and 1800 nm or less. In addition, in the near-infrared absorber, a ratio $A^1/A^2$, which is a ratio of an absorbance $A^1$ at a wavelength of 500 nm to an absorbance $A^2$ at the maximal absorption wavelength, is preferably 0.08 or less and more preferably 0.04 or less.

Examples of the near-infrared absorber include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride. Examples of the pyrrolopyrrole compound include compounds described in paragraph Nos. 0016 to 0058 of JP2009-263614A, compounds described in paragraph Nos. 0037 to 0052 of JP2011-068731A, and compounds described in paragraph Nos. 0010 to 0033 of WO2015/166873A. Examples of the squarylium compound include compounds described in paragraph Nos. 0044 to 0049 of JP2011-208101A, compounds described in paragraph Nos. 0060 and 0061 of JP6065169B, compounds described in paragraph No. 0040 of WO2016/181987A, compounds described in JP2015-176046A, compounds described in paragraph No. 0072 of WO2016/190162A, compounds described in paragraph Nos. 0196 to 0228 of JP2016-074649A, compounds described in paragraph No. 0124 of JP2017-067963A, compounds described in WO2017/135359A, compounds described in JP2017-114956A, compounds described in JP6197940B, and compounds described in WO2016/120166A. Examples of the cyanine compound include compounds described in paragraph Nos. 0044 and 0045 of JP2009-108267A, compounds described in paragraph Nos. 0026 to 0030 of JP2002-194040A, compounds described in JP2015-172004A, compounds described in JP2015-172102A, compounds described in JP2008-088426A, compounds described in paragraph No. 0090 of WO2016/190162A, and compounds described in JP2017-031394A. Examples of the croconium compound include compounds described in JP2017-082029A. Examples of the iminium compound include compounds described in JP2008-528706A, compounds described in JP2012-012399A, compounds described in JP2007-092060A, and compounds described in paragraph Nos. 0048 to 0063 of WO2018/043564A. Examples of the phthalocyanine compound include compounds described in paragraph No. 0093 of JP2012-077153A, oxytitanium phthalocyanine described in JP2006-343631A, compounds described in paragraph Nos. 0013 to 0029 of JP2013-195480A, and vanadium phthalocyanine compounds described in JP6081771B. Examples of the naphthalocyanine compound include compounds described in paragraph No. 0093 of JP2012-077153A. Examples of the dithiolene metal complex include compounds described in JP5733804B. Examples of the metal oxide include indium tin oxide, antimony tin oxide, zinc oxide, A1-doped zinc oxide, fluorine-doped tin dioxide, niobium-doped titanium dioxide, and tungsten oxide. For the details of tungsten oxide, reference can be made to paragraph No. 0080 of JP2016-006476A, the contents of which are incorporated herein by reference. Examples of the metal boride include lanthanum boride. Examples of a commercially available product of the lanthanum boride include $LaB_6$—F (manufactured by Japan New Metals Co., Ltd.). In addition, compounds described in WO2017/119394A can also be used as the metal boride. Examples of a commercially available product of the indium tin oxide include F-ITO (manufactured by DOWA Hi-Tech Co., Ltd.).

In addition, as the near-infrared absorber, squarylium compounds described in JP2017-197437A, squarylium compounds described in JP2017-025311A, squarylium compounds described in WO2016/154782A, squarylium compounds described in JP5884953B, squarylium compounds described in JP6036689B, squarylium compounds described in JP5810604B, squarylium compounds described in paragraph Nos. 0090 to 0107 of WO2017/213047A, pyrrole ring-containing compounds described in paragraph Nos. 0019 to 0075 of JP2018-054760A, pyrrole ring-containing compounds described in paragraph Nos. 0078 to 0082 of JP2018-040955A, pyrrole ring-containing compounds described in paragraph Nos. 0043 to 0069 of JP2018-002773A, squarylium compounds having an aromatic ring at the α-amide position described in paragraph Nos. 0024 to 0086 of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029, asymmetric compounds described in paragraph Nos. 0027 to 0114 of JP2017-068120A, pyrrole ring-containing compounds (carbazole type) described in JP2017-067963A, phthalocyanine compounds described in JP6251530B, and the like can also be used.

The content of the near-infrared absorber in the total solid content of the composition for forming a pixel of near-infrared cut filter is preferably 50 mass % or less, more preferably 40 mass % or less, and still more preferably 30 mass % or less. The lower limit is preferably 1 mass % or more, more preferably 3 mass % or more, and still more preferably 5 mass % or more.

The composition for forming a pixel of near-infrared cut filter can further contain a polymerizable compound, a photopolymerization initiator, a resin, a compound having a cyclic ether group, a silane coupling agent, a surfactant, an ultraviolet absorber, an organic solvent, or the like. The preferred range and contents of these materials are the same as the materials and contents described in the above-described composition for forming a colored pixel.

<Composition for Forming Pixel of Near-Infrared Transmitting Filter>

Next, a composition for forming a pixel of near-infrared transmitting filter, which is preferably used for forming the pixel of a near-infrared transmitting filter of the optical filter, will be described. The composition for forming a pixel of near-infrared transmitting filter can also contain a coloring material which allows transmission of near-infrared rays and shields visible light (hereinafter, also referred to as a "coloring material which shields visible light"). In the present invention, it is preferable that the coloring material which shields visible light is a coloring material which absorbs light in a wavelength range of violet to red. In addition, in the present invention, it is preferable that the coloring material which shields visible light is a coloring material which shields light in a wavelength range of 450 to 650 nm. In addition, it is preferable that the coloring material which shields visible light is a coloring material which allows transmission of light in a wavelength range of 900 to 1300 nm. In the present invention, it is preferable that the coloring material which shields visible light satisfies at least one of the following requirement (A) or (B).

(A): colorant which shields visible light contains two or more chromatic colorants, and a combination of the two or more chromatic colorants forms black.

(B): colorant which shields visible light contains an organic black colorant.

Examples of the chromatic colorant include the above-described chromatic colorants. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include the compounds described in JP2010-534726A, JP2012-515233A, JP2012-515234A, and the like, and the bisbenzofuranone compound is available, for example, as "Irgaphor Black" manufactured by BASE Examples of the perylene compound include compounds described in paragraph Nos. 0016 to 0020 of JP2017-226821A, and C. I. Pigment Black 31 and 32. Examples of the azomethine compound include the compounds described in JP1989-170601A (JP-H01-170601A) and JP1990-034664A (JP-H02-034664A), and the azomethine compound is available, for example, "CHROMOFINE BLACK A1103" manufactured by Dainichiseika Color & Chemicals Mfg. Co., Ltd.

In a case where a combination of two or more chromatic colorants forms black, examples of the combination of the chromatic colorants include the following.

(1) aspect in which the coloring material which shields visible light contains a yellow colorant, a blue colorant, a violet colorant, and a red colorant (2) aspect in which the coloring material which shields visible light contains a yellow colorant, a blue colorant, and a red colorant (3) aspect in which the coloring material which shields visible light contains a yellow colorant, a violet colorant, and a red colorant (4) aspect in which the coloring material which shields visible light contains a yellow colorant and a violet colorant (5) aspect in which the coloring, material which shields visible light contains a green colorant, a blue colorant, a violet colorant, and a red colorant (6) aspect in which the coloring material which shields visible light contains a violet colorant and an orange colorant (7) aspect in which the coloring material which shields visible light contains a green colorant, a violet colorant, and a red colorant (8) aspect in which the coloring material which shields visible light contains a green colorant and a red colorant The content of the coloring material which shields visible light in the total solid content of the composition for forming a pixel of near-infrared transmitting filter is preferably 60 mass % or less, more preferably 50 mass % or less, still more preferably 30 mass % or less, even more preferably 20 mass % or less, and particularly preferably 15 mass % or less. The lower limit may be, for example, 0.01 mass % or more or 0.5 mass % or more.

The composition for forming a pixel of near-infrared transmitting filter can further contain a near-infrared absorber. The preferred range and contents of these materials are the same as the materials and contents described in the above-described composition for forming a pixel of near-infrared cut filter.

The composition for forming a pixel of near-infrared transmitting filter can further contain a polymerizable compound, a photopolymerization initiator, a resin, a compound having a cyclic ether group, a silane coupling agent, a surfactant, an ultraviolet absorber, an organic solvent, or the like. The preferred range of these materials and contents is the same as the materials and contents described in the above-described composition for forming a colored pixel.

EXAMPLES

Hereinafter, the present invention will be described in more detail using examples. However, the present invention is not limited to the following examples as long as it does not depart from the gist of the present invention. In addition, in the following structural formulae, Me represents a methyl group, Et represents an ethyl group, and Ph represents a phenyl group.

<Production of Composition for Underlayer>

The following raw materials were mixed to produce a composition for an underlayer.

| | |
|---|---|
| Resin A | 0.7 parts by mass |
| Surfactant A | 0.8 parts by mass |
| Propylene glycol monomethyl ether acetate (PGMEA) | 98.5 parts by mass |

The details of the raw materials are as follows.

Resin A: CYCLOMER P (ACA) 230AA (manufactured by DAICEL-ALLNEX LTD.; acid value=30 mgKOH/g, Mw=15000, 54 mass % PGME solution)

Surfactant A: 0.2 mass % PGMEA solution of a compound having the following structure (Mw=14000, numerical value "%" indicating the proportion of a repeating unit is mol %, fluorine-based surfactant)

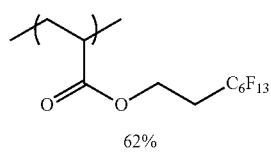

62%

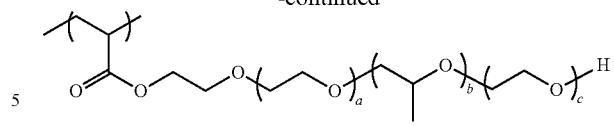

38%

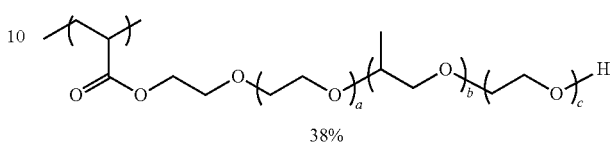

a + c = 14
b = 17

<Production of Composition for Partition Wall>

(Compositions 1 to 3 and 6 for Partition Wall)

Each component was mixed so as to have composition (numerical value of the blending amount is a part by mass) shown in the table below, and filtration was performed using DFA4201NIEY (0.45 μm nylon filter) manufactured by Nihon Pall Corporation to produce compositions 1 to 3 and 6 for a partition wall.

TABLE 1

| | Silica particle solution | | Surfactant | | Silane coupling agent | | Solvent | |
|---|---|---|---|---|---|---|---|---|
| | Type | Blending amount | Type | Blending amount | Type | Blending amount | Type | Blending amount |
| Composition 1 for partition wall | P1 | 44.8 | F-1 | 0.2 | — | — | S-1 | 8 |
| | | | | | | | S-2 | 43 |
| | | | | | | | S-4 | 2 |
| | | | | | | | S-5 | 1 |
| | | | | | | | S-6 | 1 |
| Composition 2 for partition wall | P2 | 44.8 | F-1 | 0.2 | — | — | S-1 | 8 |
| | | | | | | | S-2 | 43 |
| | | | | | | | S-4 | 2 |
| | | | | | | | S-5 | 1 |
| | | | | | | | S-6 | 1 |
| Composition 3 for partition wall | P1 | 44.8 | F-1 | 0.2 | — | — | S-1 | 8 |
| | | | | | | | S-2 | 30 |
| | | | | | | | S-4 | 2 |
| | | | | | | | S-5 | 1 |
| | | | | | | | S-6 | 1 |
| | | | | | | | S-7 | 13 |
| Composition 6 for partition wall | P3 | 26.1 | F-2 | 0.01 | Silane coupling agent 1 | 0.6 | S-1 | 14 |
| | | | | | | | S-2 | 55 |
| | | | | | | | S-4 | 2.3 |
| | | | | | | | S-5 | 1 |
| | | | | | | | S-6 | 1 |

The raw materials shown above in the table are as follows.
[Silica Particle Solution]

P1: silica particle solution which was prepared by 3.0 g of trimethylmethoxysilane as a hydrophobizing treatment agent was added to 100.0 g of propylene glycol monomethyl ether solution (silica particle concentration: 20 mass %) of silica particles (beaded silica) in which a plurality of spherical silicas having an average particle diameter of 15 nm were linked in a beaded shape by metal oxide-containing silica (linking material), and the mixture was reacted at 20° C. for 6 hours. As the average particle diameter of the spherical silica in the silica particle solution P1, the number average of circle-equivalent diameters in a projection image of the spherical portions of 50 spherical silicas measured by a transmission electron microscope (TEM) was calculated and obtained. In addition, in the silica particle solution P1, by a method of TEM observation, it was investigated whether or not the silica particle solution included silica particles having a shape in which a plurality of spherical silicas were linked in a beaded shape.

P2: THRULYA 4110 (manufactured by JGC C&C, solution of silica particles (silica particles having a hollow structure) having an average particle diameter of 60 nm; $SiO_2$ equivalent concentration of solid contents: 20 mass %)

P3: Silica Particle Solution P3 Prepared by the Following Method

A reaction mother liquor was prepared by mixing 100 g of a silica sol having an average particle diameter of 5 nm and a $SiO_2$ concentration of 20 mass % and 1900 g of pure water, and heating the mixture to 80° C. A pH of the reaction mother liquor was 10.5, and 9000 g of a 1.17 mass % sodium silicate aqueous solution as $SiO_2$ and 9000 g of a 0.83 mass % sodium aluminate aqueous solution as $Al_2O_3$ were simultaneously added to the mother liquor. During the addition, the temperature of the reaction solution was maintained at 80° C. The pH of the reaction solution rose to 12.5 immediately after the addition of sodium silicate and sodium aluminate, and remained almost unchanged thereafter. After completion of the addition, the reaction solution was cooled to room temperature, and washed with an ultrafiltration membrane to prepare a $SiO_2 \cdot Al_2O_3$ primary particle dispersion liquid having a concentration of solid contents of 20 mass %. Next, 500 g the $SiO_2 \cdot Al_2O_3$ primary particle dispersion liquid was collected, 1700 g of pure water was added thereto and heated to 98° C., and while maintaining this temperature, 50400 g of sodium aluminate having a concentration of 0.5 mass % was added thereto. Next, 3000 g of a sodium silicate aqueous solution having a concentration of 1.17 mass % as $SiO_2$ and 9000 g of a sodium aluminate aqueous solution having a concentration of 0.5 mass % as $Al_2O_3$ were added thereto to obtain a composite oxide fine particle dispersion liquid. Next, the dispersion liquid was washed with an ultrafiltration membrane to obtain a composite oxide fine particle dispersion liquid having a concentration of solid contents of 13 mass %. 1125 g of pure water was added to 500 g of the composite oxide fine particle dispersion liquid, and concentrated hydrochloric acid (35.5%) was further added dropwise thereto to adjust the pH to 1.0, and a dealumination treatment was performed. Next, the aluminum salt dissolved in the ultrafiltration membrane was separated and washed while adding 10 L of a hydrochloric acid aqueous solution having a pH of 3 and 5 L of pure water to obtain a dispersion liquid of silica-based fine particles (1) having a concentration of solid contents of 20 mass %. 500 g of pure water, 1750 g of ethanol, and 626 g of 28% ammonia water were added to 1500 g of the aqueous dispersion liquid of silica-based fine particles (1), the obtained mixed solution was heated to 35° C., and 104 g of ethyl silicate ($SiO_2$: 28 mass %) was added thereto. Next, the ultrafiltration membrane was washed while adding 5 L of pure water to prepare a dispersion liquid of silica-based fine particles (2) having a concentration of solid contents of 20 mass %. Next, the dispersion liquid of silica-based fine particles (2) was subjected to a hydrothermal treatment at 200° C. for 11 hours, and the ultrafiltration membrane was washed while adding 5 L of pure water to adjust the concentration of solid contents to 20 mass %. Then, using an ultrafiltration membrane, a dispersion medium of the dispersion liquid was replaced with propylene glycol monomethyl ether to prepare an organosol having a concentration of solid contents of 20 mass %. The organosol is an organosol (hereinafter, referred to as a "hollow silica sol A") in which hollow silica fine particles having an average particle diameter of 23 nm were dispersed. 200 g of the hollow silica sol A (concentration of solid contents of silica: 20 mass %) was prepared, and the solvent was replaced with methanol using an ultrafiltration membrane to prepare 100 g of an organosol having a $SiO_2$ content of 20 mass % (moisture content was 0.5 mass % with respect to the $SiO_2$ content). A 28% ammonia aqueous solution was added to 100 g of the organosol so as to be 100 ppm by mass as ammonia, and mixed, and 4 g (corresponding to 20 parts by mass with respect to 100 parts by mass of the $SiO_2$ content) of methacrylsilane (KBM 503 manufactured by Shin-Etsu Chemical Co., Ltd.) was added thereto to prepare a reaction solution (moisture content was 0.6 mass % with respect to the $SiO_2$ content). The reaction solution was heated to 50°, and heated at 50° C. for 15 hours with stirring. After completion of the heating, the reaction solution was cooled to normal temperature and washed with an ultrafiltration membrane to prepare a silica particle solution P3 composed of coated hollow fine particles having a $SiO_2$ concentration of 20 mass %.

[Surfactant]

F-1: compound having the following structure (silicone-based nonionic surfactant, carbinol-modified silicone compound; weight-average molecular weight=3000, kinematic viscosity at 25° C.=45 mm²/s)

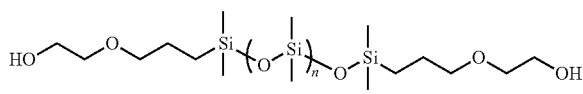

F-2: compound having the following structure

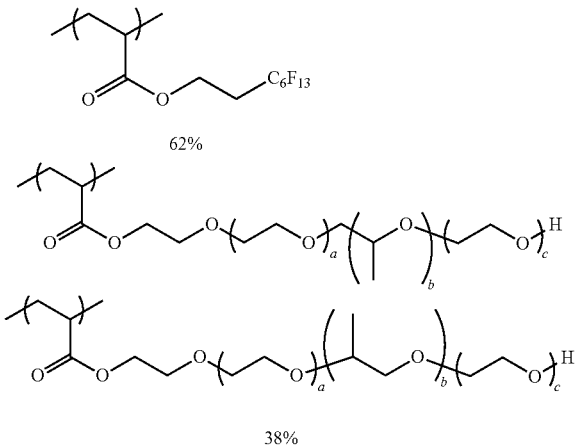

-continued a + c = 14
b = 17

[Silane Coupling Agent]
Silane Coupling Agent 1: Compound Having the Following Structure

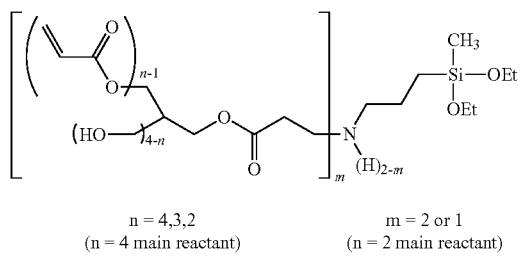

n = 4,3,2
(n = 4 main reactant)

m = 2 or 1
(n = 2 main reactant)

[Solvent]
S-1: 1,4-butanediol diacetate (boiling point: 232° C., viscosity: 3.1 mPa·s, molecular weight: 174)
S-2: propylene glycol monomethyl ether acetate (boiling point: 146° C., viscosity: 1.1 mPa·s, molecular weight: 132)
S-4: methanol (boiling point: 64° C., viscosity: 0.6 mPa·s)
S-5: ethanol (boiling point: 78° C., viscosity: 1.2 mPa·s)
S-6: water (boiling point: 100° C., viscosity: 0.9 mPa·s)
S-7: compound having the following structure (in the following structural formula, n=6)

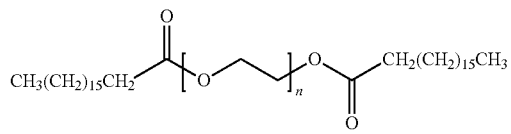

(Composition 4 for Partition Wall)
300 g of a cation exchange resin powder (WK-40, manufactured by Mitsubishi Chemical Corporation) was added to 1000 g of an aqueous solution including 40 mass % of tetrapropylammonium hydroxide (TPAOH, manufactured by Lion Specialty Chemicals Co., Ltd.), and after stirring at a rate of 100 rpm for 1 hour under room temperature conditions, the added cation exchange resin powder was removed by filtration. Next, 2100 g of an anion exchange resin powder (SAT-10, manufactured by Mitsubishi Chemical Corporation) was added thereto, and after stirring at a rate of 100 rpm for 1 hour under room temperature conditions, the added anion exchange resin powder was removed by filtration. Ultrapure water was added to the obtained aqueous solution of tetrapropylammonium hydroxide (TPAOH) to adjust the concentration to 10 mass %, and each amount of alkali metal element compounds of sodium (Na) and potassium (K) and halogen group element compounds of bromine (Br) and chlorine (Cl), which was included in the aqueous solution as impurities, was measured by an atomic absorption spectroscopy (AAS method, Polarization Zeeman atomic absorption photometer Z-5710 manufactured by Hitachi, Ltd.) and an ion chromatography (2020i manufactured by DIONEX). Further, ultrapure water was added to an aqueous solution of tetrapropylammonium hydroxide (commercially available product) before the above-described ion exchange treatment to adjust the concentration to 10 mass %, and the contents of impurities included therein were measured in the same manner. As a result, the amounts of impurities included in the aqueous solution before the ion exchange treatment was 50 ppm by mass of sodium, 2500 ppm by mass of potassium, 2250 ppm by mass of bromine, and 13 ppm by mass of chlorine on an elemental basis. On the other hand, the contents of impurities included in the aqueous solution after the ion exchange treatment were 10 ppb by mass or less (detection limit) of sodium, 10 ppb by mass (detection limit) of potassium, 1 ppm by mass or less of bromine, and 1 ppm by mass or less of chlorine on an elemental basis. Next, tetraethyl orthosilicate (TEOS, manufactured by Tama Chemicals Co., Ltd.), methyltrimethoxysilane (MTMS, manufactured by Shin-Etsu Chemical Co., Ltd.), and ethanol (EtOH, manufactured by FUJIFILM Wako Pure Chemical Corporation) having a concentration of 99.5 mass % were mixed, and the mixed solution was held at a temperature of 20° C. and stified at a rate of 150 rpm for 30 minutes. A highly purified aqueous solution of tetrapropylammonium hydroxide (including 10 mass % of TPAOH) was added dropwise to the mixed solution over 10 minutes, and the mixture was further stirred at a temperature of 20° C. at a rate of 200 rpm for 1 hour. Thereafter, the mixture was heated to a temperature of 50° C., and under these temperature conditions, silica-based film forming components (TEOS and MTMS) were hydrolyzed for 20 hours with stirring at a rate of 200 rpm. Next, the ethanol in the mixed solution including the hydrolyzate of the silica-based film forming components was subjected to a step of solvent-replacing with propylene glycol monopropyl ether using a rotary evaporator, and then the concentration of a silica compound composed of the hydrolyzate of the tetraethyl orthosilicate (TEOS) and the methyltrimethoxysilane (MTMS) was adjusted to obtain a liquid composition including, 12 mass % of this compound on a $SiO_2$ conversion basis. The liquid composition is defined as a composition 4 for a partition wall.

(Composition 5 for Partition Wall)
In a 500 ml three-neck flask, 0.05 g (0.4 mmol) of methyltrimethoxysilane (KBM-13; manufactured by Shin-Etsu Chemical Co., Ltd.), 0.66 g (3.0 mmol) of trifluoropropyltrimethoxysilane (KBM-7103; manufactured by Shin-Etsu Chemical Co., Ltd.), 0.10 g (0.4 mmol) of trimethoxysilylpropyl succinic acid anhydride (KBM-967; manufactured by Shin-Etsu Chemical Co., Ltd.), 7.97 g (34 mmol) of γ-acryloxypropyltrimethoxysilane (KBM-5103; manufactured by Shin-Etsu Chemical Co., Ltd.), and 224.37 g of an isopropyl alcohol dispersion liquid (IPA-ST-UP; manufactured by Nissan Chemical Corporation) having 15.6 mass % of silica particles were mixed, and 163.93 g of ethylene glycol mono-t-butyl ether was added thereto. While stirring at room temperature, a phosphoric acid aqueous solution prepared by dissolving 0.088 g of phosphoric acid in 4.09 g of water was added thereto over 3 minutes. Thereafter, the flask was immersed in an oil bath at 40° C. and stirred for 60 minutes, and then the temperature of the oil bath was raised to 115° C. over 30 minutes. One hour after the start of temperature rise, the internal temperature of the solution reached 100° C., and then the mixture was heated and stirred for another 2 hours (internal temperature was 100° C. to 110° C.) to obtain a composition 4 for a partition wall. A concentration of solid contents of the obtained composition 4 for a partition wall was 24.3 mass %, and the contents of a polysiloxane and silica particles in the solid content were 15 mass % and 85 mass %, respectively.

<Production of Composition for Forming Pixel>
(Production of Dispersion Liquid)

A mixed solution obtained by mixing raw materials shown in the table below was mixed and dispersed for 3 hours using a beads mill (zirconia beads having a diameter of 0.1 mm). Next, using a high-pressure disperser NANO-3000-10 (manufactured by Nippon BEE Chemical Co., Ltd.) equipped with a pressure reducing mechanism, the mixed solution was dispersed under a pressure of 2000 kg/cm$^3$ at a flow rate of 500 g/min. The dispersion treatment was repeated a total of 10 times to obtain each dispersion liquid. The numerical values described in the table below indicate parts by mass.

TABLE 2

|  | Dispersion liquid G1 | Dispersion liquid G2 | Dispersion liquid G3 | Dispersion liquid G4 | Dispersion liquid G5 | Dispersion liquid R1 | Dispersion liquid B1 | Dispersion liquid Y1 | Dispersion liquid M1 | Dispersion liquid C1 |
|---|---|---|---|---|---|---|---|---|---|---|
| PG7 |  |  |  |  |  |  |  |  |  | 10.0 |
| PG58 | 8.5 | 8.5 | 8.5 |  |  |  |  |  |  |  |
| PG36 |  |  |  | 8.5 | 8.5 |  |  |  |  |  |
| PY129 |  | 1.1 | 1.5 | 1.1 | 1.5 |  |  |  |  |  |
| PY139 |  | 3.0 | 7.6 | 3.0 | 2.6 | 0.9 |  |  |  |  |
| PY150 |  |  |  |  |  |  |  | 10.0 |  |  |
| PY185 | 2.9 |  |  |  |  |  |  |  |  |  |
| PR122 |  |  |  |  |  |  |  |  | 10.0 |  |
| PR254 |  |  |  |  |  | 10.5 |  |  |  |  |
| PB15:6 |  |  |  |  |  |  | 9.6 |  |  |  |
| PV23 |  |  |  |  |  |  | 2.4 |  |  |  |
| Pigment derivative 1 | 1.6 |  |  |  |  | 1.6 | 1.0 |  |  | 1.1 |
| Pigment derivative 2 |  |  |  |  |  |  |  |  | 1.1 |  |
| Pigment derivative 3 |  |  |  |  |  |  |  | 1.1 |  |  |
| Pigment derivative 4 |  | 1.4 | 1.4 | 1.4 | 1.4 |  |  |  |  |  |
| Dispersant 1 | 4.7 |  |  |  |  | 4.7 | 4.7 |  | 6.7 | 6.7 |
| Dispersant 2 |  |  |  |  |  |  |  | 6.7 |  |  |
| Dispersant 3 |  | 5.0 | 5.0 | 5.0 | 5.0 |  |  |  |  |  |
| Solvent 1 | 82.3 | 81.0 | 81.0 | 81.0 | 81.0 | 82.3 | 82.3 | 89.2 | 82.2 | 82.2 |

The raw materials shown above in the table are as follows.

[Colorant]
PG7: C. I. Pigment Green 7
PG58: C. I. Pigment Green 58
PG36: C. I. Pigment Green 36
PY129: C. I. Pigment Yellow 129
PY139: C. I. Pigment Yellow 139
PY150: C. I. Pigment Yellow 150
PY185: C. I. Pigment Yellow 185
PR122: C. I. Pigment Red 122
PR254: C. I. Pigment Red 254
PB15:6: C. I. Pigment Blue 15:6
PV23: C. I. Pigment Violet 23

[Pigment Derivative]

Pigment derivative 1: compound having the following structure

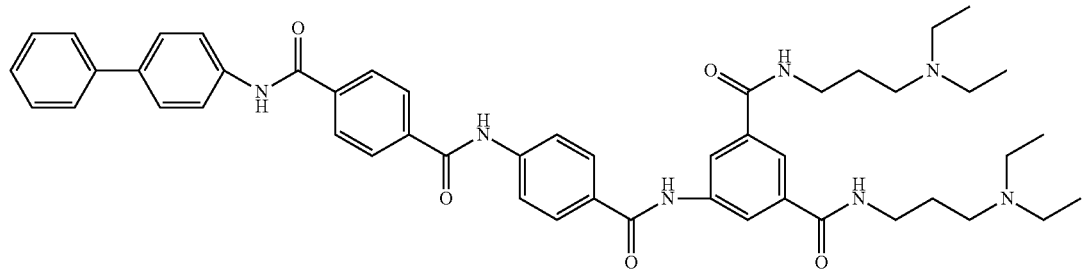

-continued

Pigment derivative 2: compound having the following structure

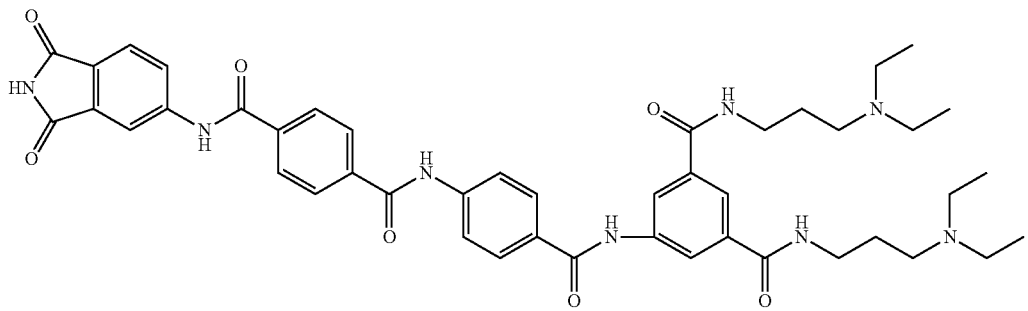

Pigment derivative 3: compound having the following structure

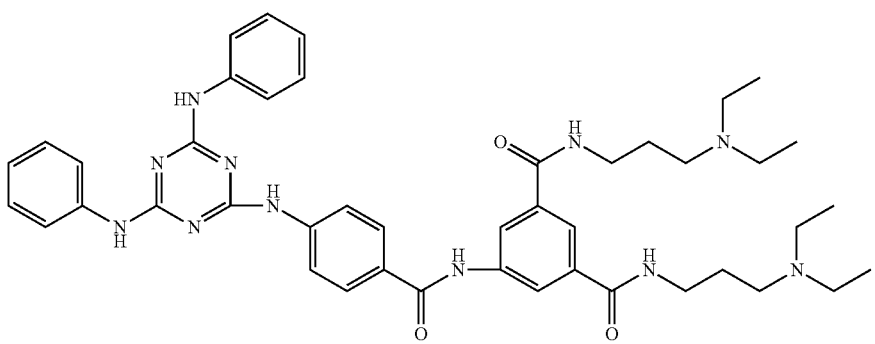

Pigment derivative 4: compound having the following structure

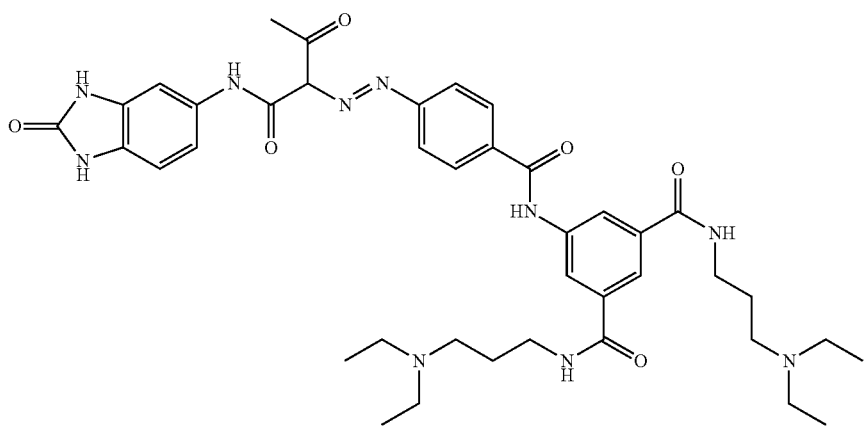

[Dispersant]

Dispersant 1: resin having the following structure (the numerical value described together with the main chain indicates a molar ratio of a repeating unit, and the numerical value described together with the side chain indicates the number of repeating units)

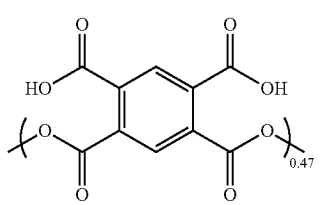

-continued

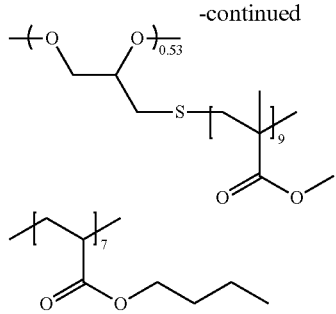

Dispersant 2: resin having the following structure (the numerical value described together with the main chain indicates a molar ratio of a repeating unit, and the numerical value described together with the side chain indicates the number of repeating units; Mw: 20000, C=C value: 0.4 mmol/g, acid value: 70 mgKOH/g)

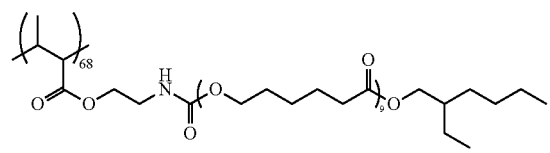

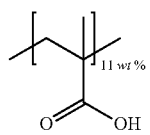

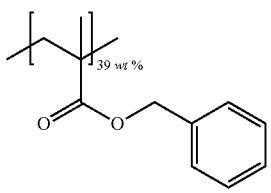

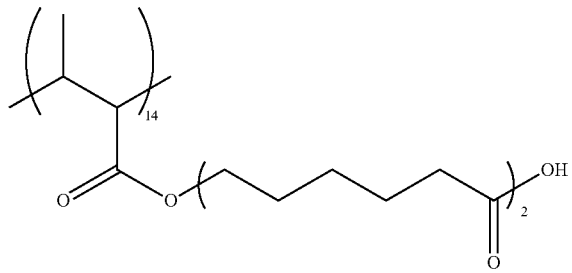

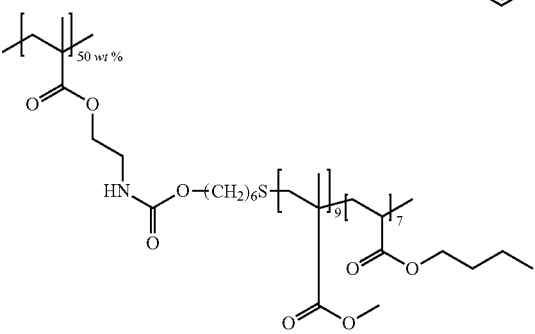

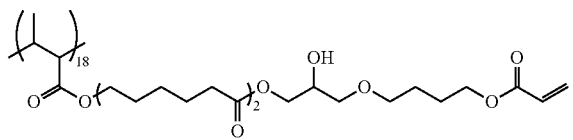

Dispersant 3: resin having the following structure (the numerical value described together with the main chain indicates wt %, and the numerical value described together with the side chain indicates the number of repeating units; Mw: 13000, acid value: 65 mgKOH/g)

[Solvent]
Solvent 1: PGMEA
(Preparation of Composition for Forming Pixel)

After stirring a mixed solution obtained by mixing the following raw materials, the mixed solution was filtered through a nylon filter (manufactured by Nihon Pall Corporation) having a pore diameter of 0.45 μm to obtain each of composition for forming a pixel (green coloring composition G1 to G7, red coloring composition R1, blue coloring composition B1, yellow coloring composition Y1, magenta coloring composition M1, and cyan coloring composition C1). The numerical values described in the table below indicate parts by mass.

TABLE 3

| | Green coloring composition G1 | Green coloring composition G2 | Green coloring composition G3 | Green coloring composition G4 | Green coloring composition G5 | Green coloring composition G6 | Green coloring composition G7 |
|---|---|---|---|---|---|---|---|
| Dispersion liquid G1 | 69 | | | | | | |
| Dispersion liquid G2 | | 78.2 | 78.2 | | | | |
| Dispersion liquid G3 | | | | 78.2 | | | |
| Dispersion liquid G4 | | | | | 78.2 | 78.2 | |
| Dispersion liquid G5 | | | | | | | 78.2 |
| Dispersion liquid R1 | | | | | | | |
| Dispersion liquid B1 | | | | | | | |
| Dispersion liquid Y1 | | | | | | | |
| Dispersion liquid M1 | | | | | | | |
| Dispersion liquid C1 | | | | | | | |
| Resin 1 | 1.2 | 0.3 | 0.3 | 0.3 | 0.3 | 0.3 | 0.3 |
| Resin 2 | | | | | | | |
| Polymerizable compound 1 | 1.1 | | | | | | |
| Polymerizable compound 2 | | 2.5 | 2.5 | 2.5 | 2.5 | 2.5 | 2.5 |
| Polymerizable compound3 | | | | | | | |
| Pholopolynicrization initiator | 0.5 | | | | | | |
| Photopolymerization initiator 2 | | | | | | | |
| Photopolymerization initiator 3 | | | | | | | |
| Photopolymerization initiator 4 | | 0.8 | 0.8 | 0.8 | 0.8 | 0.8 | 0.8 |
| Surfactant1 | 4.2 | | | | | | |
| Surfactant2 | | | | | | | |
| Surfactant3 | | 4.2 | 4.2 | 4.2 | 4.2 | 4.2 | 4.2 |
| Ultraviolet absorber 1 | 0.5 | | | | | | |
| Ultraviolet absorber 2 | | | 0.8 | | | 0.8 | |
| Silane coupling agent 1 | | | | | | | |

TABLE 3-continued

| | Green coloring composition G1 | Green coloring composition G2 | Green coloring composition G3 | Green coloring composition G4 | Green coloring composition G5 | Green coloring composition G6 | Green coloring composition G7 |
|---|---|---|---|---|---|---|---|
| Silane coupling agent 2 | | 0.4 | | 0.4 | 0.4 | | 0.4 |
| Epoxy compound 1 | 0.2 | 0.4 | | 0.4 | 0.4 | | 0.4 |
| Solvent 1 | 23.3 | 13.3 | 13.3 | 13.3 | 13.3 | 13.3 | 13.3 |
| Solvent 2 | | | | | | | |

TABLE 4

| | Red coloring composition R1 | Blue coloring composition B1 | Yellow coloring composition Y1 | Magenta coloring composition M1 | Cyan coloring composition C1 |
|---|---|---|---|---|---|
| Dispersion liquid G1 | | | | | |
| Dispersion liquid G2 | | | | | |
| Dispersion liquid G3 | | | | | |
| Dispersion liquid G4 | | | | | |
| Dispersion liquid G5 | | | | | |
| Dispersion liquid R1 | 58.9 | | | | |
| Dispersion liquid B1 | | 54.1 | | | |
| Dispersion liquid Y1 | | | 53.8 | | |
| Dispersion liquid M1 | | | | 62.4 | |
| Dispersion liquid C1 | | | | | 49.3 |
| Resin 1 | 2 | 1 | | | 0.6 |
| Resin 2 | | | 3.3 | | |
| Polymerizable compound 1 | 0.9 | 0.9 | | | |
| Polymerizable compound 2 | | | 2.4 | 0.6 | 3 |
| Polymerizable compound 3 | | | | 2.2 | |
| Photopolymerization initiator 1 | 0.5 | 0.6 | | 0.7 | |
| Photopolymerization initiator 2 | | | | | 0.6 |
| Photopolymerization initiator 3 | | | 0.9 | | |
| Photopolymerization initiator 4 | | | | | |
| Surfactant 1 | 4.2 | 4.2 | 4.2 | 4.2 | |
| Surfactant 2 | | | | | 4.2 |
| Surfactant 3 | | | | | |
| Ultraviolet absorber 1 | 0.1 | 0.1 | 0.7 | 0.4 | 0.4 |
| Ultraviolet absorber 2 | | | | | |
| Slime coupling agent 1 | | | | 0.1 | |
| Slime coupling agent 2 | | | | | |
| Epoxy compound 1 | 0.1 | 0.1 | | | |
| Solvent 1 | 33.3 | 39 | 34.7 | 29.4 | 15.6 |
| Solvent 2 | | | | | 26.3 |

The raw materials shown above in the table are as follows.

[Dispersion Liquid]

Dispersion liquids G1 to G5, dispersion liquid R1, dispersion liquid B1, dispersion liquid Y1, dispersion liquid M1, dispersion liquid C1: dispersion liquids G1 to G5, dispersion liquid R1, dispersion liquid B1, dispersion liquid Y1, dispersion liquid M1, and dispersion liquid C1 described above

[Resin]

Resin 1: 40 mass % PGMEA solution of a resin having the following structure (the numerical value described together with the main chain indicates a molar ratio of a repeating unit)

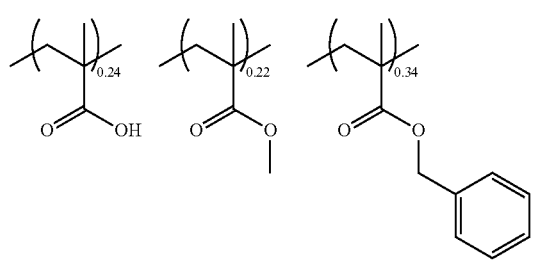

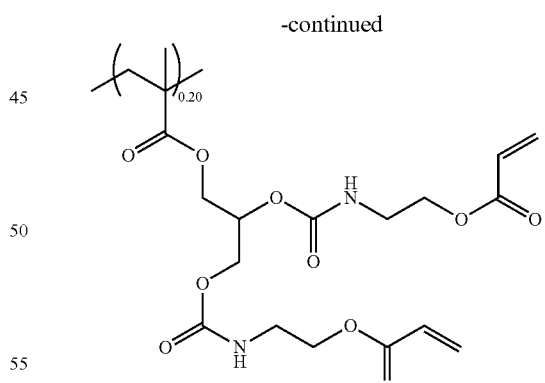

Resin 2: 40 mass % PGMEA solution of a resin having the following structure (the numerical value described together with the main chain indicates a molar ratio of a repeating unit; Mw: 18000)

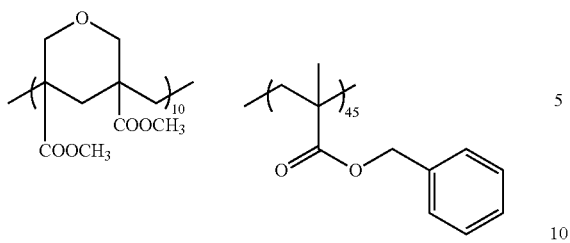
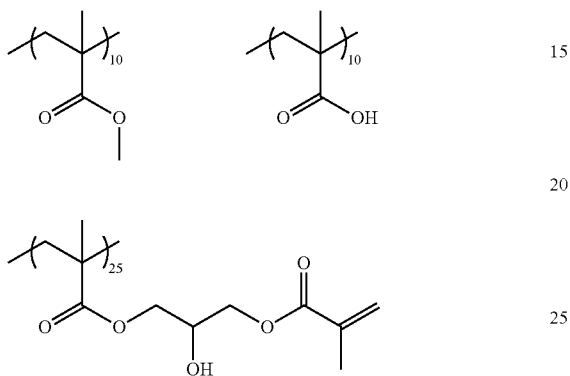
[Polymerizable Compound]
Polymerizable compound 1: compound having the following structure
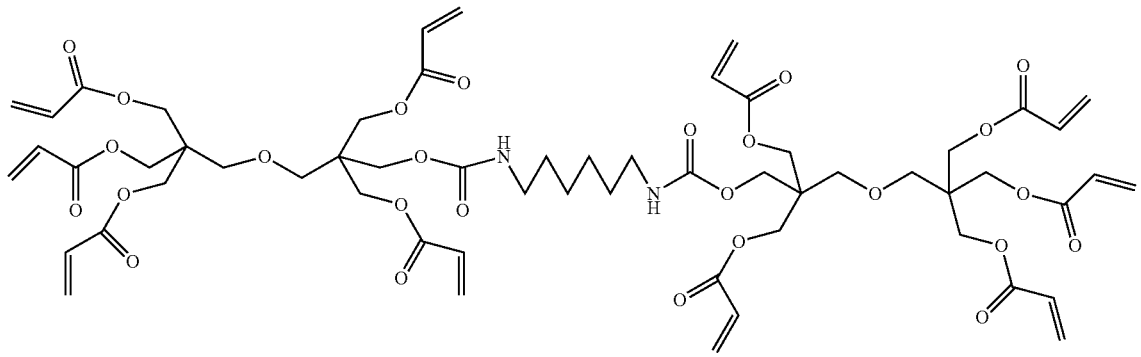 [SMILES: C=CC(=O)OCC(COCC(COC(=O)C=C)(COC(=O)C=C)COC(=O)NCCCCCCNC(=O)OCC(COCC(COC(=O)C=C)(COC(=O)C=C)COC(=O)C=C)(COC(=O)C=C)COC(=O)C=C)(COC(=O)C=C)COC(=O)C=C]
Polymerizable compound 2: compound having the following structure
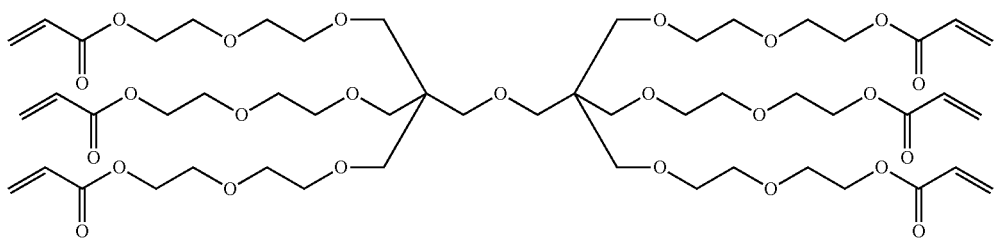 [SMILES: C=CC(=O)OCCOCCOCCC(CCOCCOCCOC(=O)C=C)(COCCOCCOC(=O)C=C)COCC(CCOCCOCCOC(=O)C=C)(CCOCCOCCOC(=O)C=C)COCCOCCOC(=O)C=C]

Polymerizable compound 3: mixture of the following structural compounds (molar ratio between a left compound and a right compound: 7:3)

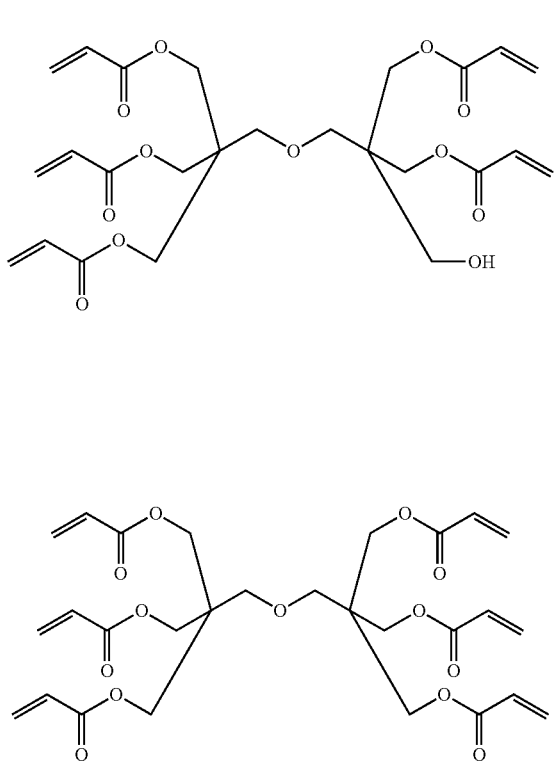

[Photopolymerization Initiator]

Photopolymerization initiator 1: compound having the following structure

Photopolymerization initiator 2: compound having the following structure

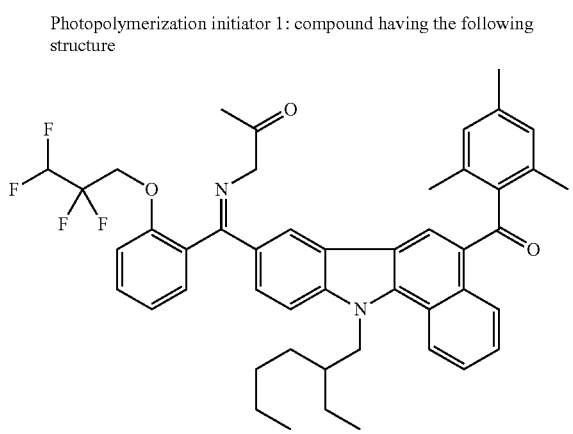

Photopolymerization initiator 3: compound having the following structure

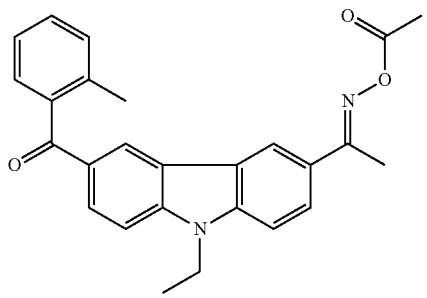

Photopolymerization initiator 4: compound having the following structure

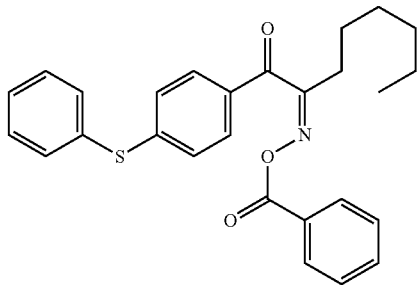

[Surfactant]

Surfactant 1: 1 mass % PGMEA solution of a compound having the following structure (Mw=14000, numerical value "%" indicating the proportion of a repeating unit is mol %, fluorine-based surfactant)

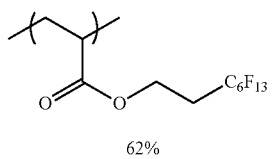

62%

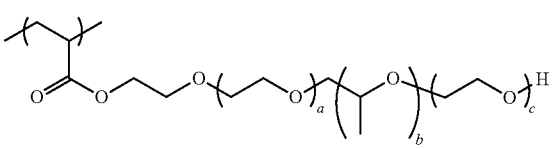

38% a + c = 14
b = 17

Surfactant 2: 0.2 mass % ethyl 3-ethoxypropionate (EEP) solution of a compound having the following structure (Mw=14000, numerical value "%" indicating the proportion of a repeating unit is mol %, fluorine-based surfactant)

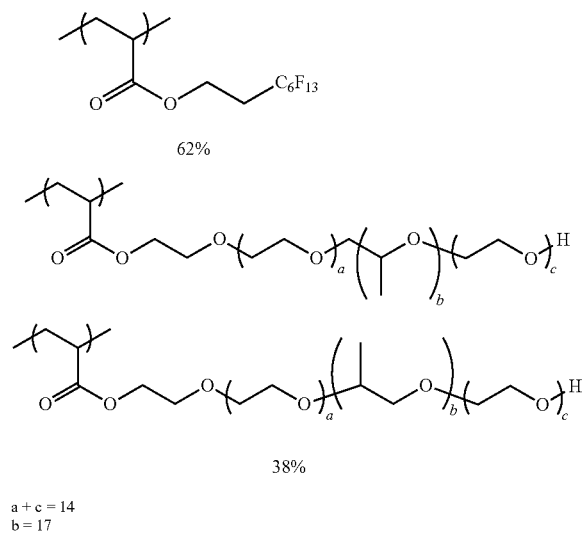

a + c = 14
b = 17

Surfactant 3: 0.2 mass % PGMEA solution of a compound having the following structure (Mw=3000)

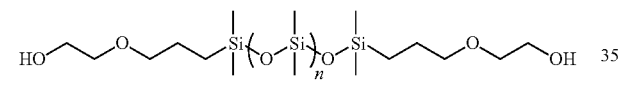

[Ultraviolet Absorber]

Ultraviolet absorber 1: compound having the following structure

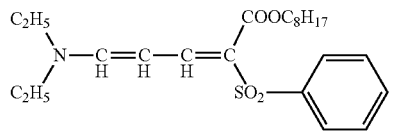

Ultraviolet absorber 2: compound having the following structure

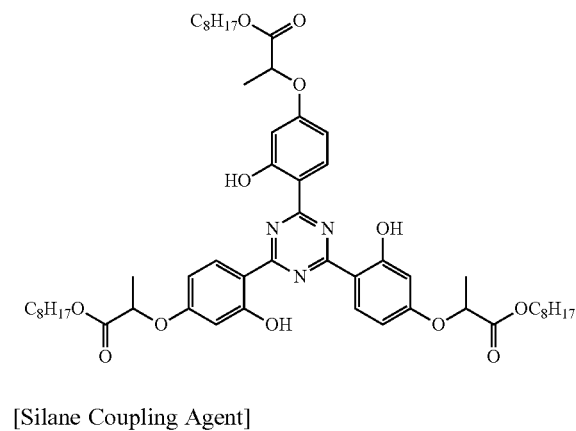

[Silane Coupling Agent]

Silane coupling agent 1: compound having the following structure n = 4,3,2         m = 2 or 1
(n = 4 main reactant)   (n = 2 main reactant Silane coupling agent 2: compound having the following structure

[Epoxy Compound]
Epoxy compound 1: EHPE 3150 (manufactured by DAICEL-ALLNEX LTD.; 1,2-epoxy-4-(2-oxiranyl)cyclohexane adduct of 2,2'-bis(hydroxymethyl)-1-butanol)
[Solvent]
Solvent 1: PGMEA
Solvent 2: ethyl 3-ethoxypropionate (EEP)
<Production of Lens Material Composition>
(Lens Material Composition 1)
The following raw materials were mixed to produce a lens material composition 1.

| -Raw material of lens material composition 1- | |
|---|---|
| Resin having the following structure (Mw: 19000, the numerical value described together with the main chain indicates a molar ratio of a repeating unit) | 10 parts by mass |

-continued

| -Raw material of lens material composition 1- | |
|---|---|
| Surfactant (FTERGENT DFX-18, manufactured by Neos Company Limited) | 0.01 parts by mass |
| PGMEA | 51.4 parts by mass |
| Propylene glycol monomethyl ether (PGME) | 22.0 parts by mass |

(Lens Material Composition 2)
[Production of Dispersion Liquid IR-1]

The following raw materials were mixed to produce a dispersion liquid IR-1.

| | |
|---|---|
| Near-infrared absorbing dye (compound having the following structure) 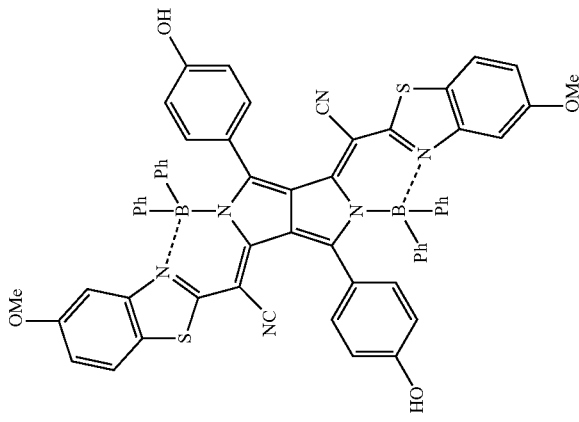 -Raw material of dispersion liquid IR-1- | 6.1 parts by mass |

-continued

-Raw material of dispersion liquid IR-1-

Pigment derivative (compound having the following structure) 1.5 parts by mass

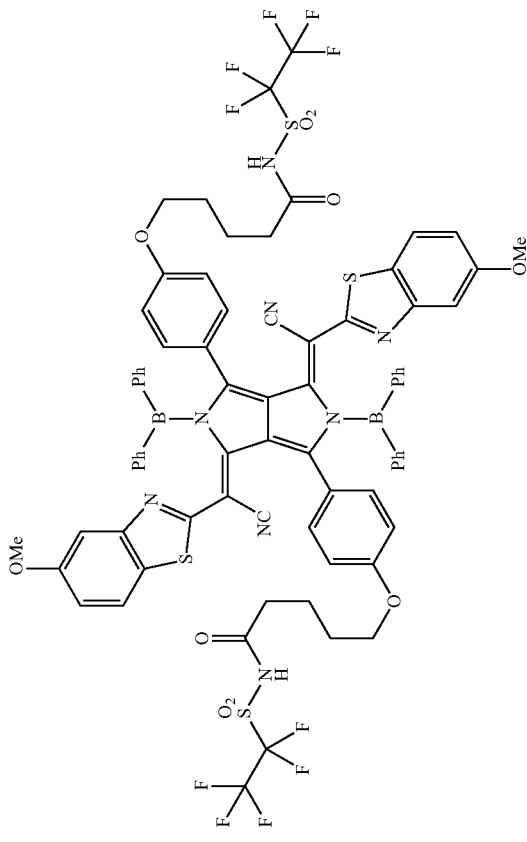

Dispersant (resin having the following structure; the numerical value described together with the main chain indicates a molar ratio of a repeating unit, and the numerical value described together with the side chain indicates the number of repeating units; Mw = 20000) 6.1 parts by mass

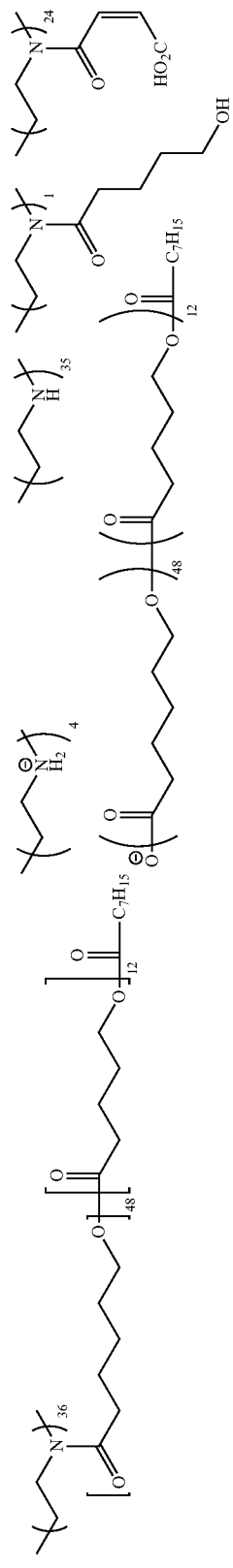

PGMEA 86.3 parts by mass

[Production of Lens Material Composition 2]

The following raw materials were mixed to produce a lens material composition 2.

300 seconds using a hot plate to form a film. In a case where the composition 5 for a partition wall was used, the silicon wafer was further heated at 300° C. for 10 minutes to form

| -Raw material of lens material composition 2- | |
|---|---|
| Dispersion liquid IR-1 | 12.0 parts by mass |
| Polymerizable compound (compound having the following structure) 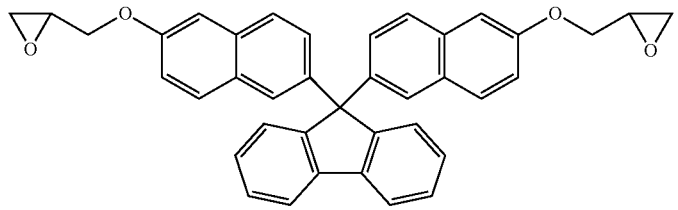 [SMILES: c1ccc2c(c1)-c1ccccc1C2(c1ccc2cc(OCC3CO3)ccc2c1)c1ccc2cc(OCC3CO3)ccc2c1] | 6.9 parts by mass |
| Resin (resin having the following structure) 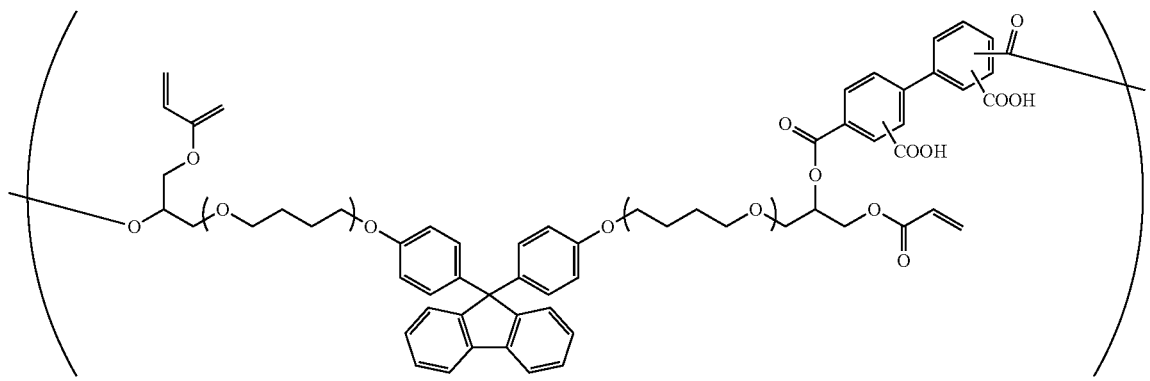 | 10.8 parts by mass |
| Antioxidant (ADEKA STAB AO-80 (manufactured by ADEKA Corporation)) | 0.195 parts by mass |
| Polymerization inhibitor (p-methoxyphenol) | 0.0195 parts by mass |
| Surfactant (compound having the following structure (Mw = 14000, numerical value "%" indicating the proportion of a repeating unit is mol %, fluorine-based surfactant)) 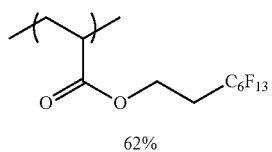 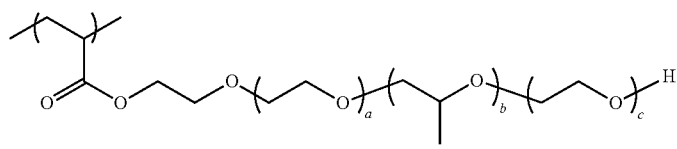 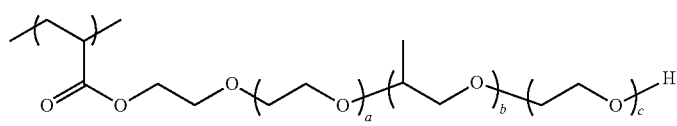 | 0.00025 parts by mass |
| PGMEA | 22.5 parts by mass |
| PGME | 42.8 parts by mass |

<Manufacturing of Solid-State Imaging Element>

Examples 1 to 27

As a support, a silicon wafer having a diameter of 8 inches (20.32 cm) on which a silicon photodiode had been formed was used. A surface of the silicon wafer on the side where the silicon photodiode had been formed was post-baked and coated with the composition for forming a partition wall shown in the table below by a spin coating method, such that a film thickness was as shown in the table below, and heated at 100° C. for 120 seconds and further heated at 200° C. for 300 seconds using a hot plate to form a film. In a case where the composition 5 for a partition wall was used, the silicon wafer was further heated at 300° C. for 10 minutes to form a film. These films were patterned by a dry etching method under the conditions described in paragraph Nos. 0128 and 0133 of JP2016-014856A, thereby forming a partition wall in a lattice form at the pitch shown in the table below. The width, height, and refractive index of the partition wall, and the dimensions of the opening of the partition walls on the silicon wafer (area partitioned by the partition walls on the silicon wafer) were shown in table below, respectively.

Next, surfaces of the silicon wafer on which these partition walls had been formed and the partition walls were coated with the composition for an underlayer produced above by a spin coating method, and heated at 100° C. for 2 minutes and further heated at 230° C. for 2 minutes using a hot plate to form an underlayer having a film thickness of 10 nm on the surfaces of the silicon wafer and the partition walls.

Next, the surface of the silicon wafer on which the partition walls had been formed was coated with a composition for forming a first colored pixel shown in the table below by a spin coating method, and heated at 100° C. for 2 minutes using a hot plate to form a composition layer of first color. Next, using an i-ray stepper exposure device FPA-3000 i5+(manufactured by Canon Inc.), the above-described composition layer was exposed through a mask having a Bayer pattern with an exposure amount of 150 mJ/cm². Next, a puddle development was performed to the composition layer at 23° C. for 60 seconds using a 0.3 mass % aqueous solution of tetramethylammonium hydroxide (TMAH). Thereafter, rinsing with a spin shower and washing with pure water were performed thereto, and the silicon wafer was further heated at 220° C. for 5 minutes using a hot plate, thereby forming a first colored pixel in the area partitioned by the partition walls on the silicon wafer. With regard to a composition for forming a second colored pixel and a composition for forming a third colored pixel, development and exposure were performed in the same manner as in the composition for forming a first colored pixel, and an optical filter was formed by sequentially forming a second colored pixel and a third colored pixel in the area partitioned by the partition walls on the silicon wafer. The height and refractive index of the pixels are shown in the table below. In addition, the pixel pitch is also shown in the table below. The pixel pitch is a total size of the width of the pixel and the width of the partition wall (total size of the size (width) of the opening portion of the partition wall and the width of the partition wall).

Next, the optical filter was coated with a lens material composition shown in the table below by a spin coating method, heated at 100° C. for 2 minutes using a hot plate, and then heated at 200° C. for 5 minutes to form a lens material composition layer having a film thickness of 1.2 μm. Thereafter, using a transfer method by etch-back, which is a known technique, a microlens was formed by processing the lens material composition layer such that the height from the lens top to the lens bottom was 400 nm, thereby manufacturing a solid-state imaging element.

The refractive index of the partition wall was measured by the following method. That is, the composition for a partition wall was applied to a quartz glass substrate using a spin coater (manufactured by Mikasa Co., Ltd.) to form a coating film, heated (pre-baked) at 100° C. for 120 seconds using a hot plate, and then heated (post-baked) at 200° C. for 300 seconds using a hot plate to form a film having a thickness of 0.3 μm. With regard to the obtained film, a refractive index with respect to light having a wavelength of 533 nm was measured using ellipsometry VUV-VASE (manufactured by J.A. Woollam Co., Inc.).

In addition, the refractive index of the pixel was measured by the following method. That is, the coloring composition was applied to a quartz glass substrate using a spin coater (manufactured by Mikasa Co., Ltd.) to form a coating film, heated (pre-baked) at 100° C. for 120 seconds using a hot plate, and then heated (post-baked) at 200° C. for 300 seconds using a hot plate to form a film having a thickness of 0.3 μm. With regard to the obtained film, a refractive index with respect to light having a wavelength of 1000 nm was measured using ellipsometry VUV-VASE (manufactured by J.A. Woollam Co., Inc.).

Comparative Example 1

As a support, a silicon wafer having a diameter of 8 inches (20.32 cm) on which a silicon photodiode had been formed was used. A surface of the silicon wafer on the side where the silicon photodiode had been formed was spin-coated with the composition for an underlayer produced above by a spin coating method, heated at 100° C. for 2 minutes using a hot plate, further heated at 230° C. for 2 minutes using a hot plate, thereby forming an underlayer having a film thickness of 10 nm.

Next, a surface of the underlayer was coated with a coloring composition of first color shown in the table below by a spin coating method, and heated at 100° C. for 2 minutes using a hot plate to form a coloring composition layer of first color. Next, using an i-ray stepper exposure device FPA-3000 i5+ (manufactured by Canon Inc.), the above-described coloring composition layer was exposed through a mask having a Bayer pattern with an exposure amount of 150 mJ/cm². Next, a puddle development was performed to the coloring composition layer of first color at 23° C. for 60 seconds using a 0.3 mass % aqueous solution of tetramethylammonium hydroxide (TMAH). Thereafter, rinsing with a spin shower and washing with pure water were performed thereto, and the silicon wafer was further heated at 220° C. for 5 minutes using a hot plate, thereby forming a first colored pixel. With regard to a coloring composition of second color and a coloring composition of third color, development and exposure were performed in the same manner as in the coloring composition of first color, and an optical filter was formed by sequentially forming a second colored pixel and a third colored pixel in a missing portion of the first colored pixel. The height and refractive index of the pixels are shown in the table below. In addition, the pixel pitch is also shown in the table below. In Comparative Example 1, the pixel pitch is the width of the pixel.

Next, the optical filter was coated with a lens material composition shown in the table below by a spin coating method, heated at 100° C. for 2 minutes using a hot plate, and then heated at 200° C. for 5 minutes to form a lens material composition layer having a film thickness of 1.2 μm. Thereafter, using a transfer method by etch-back, which is a known technique, a microlens was formed by processing the lens material composition layer such that the height from the lens top to the lens bottom was 400 nm, thereby manufacturing a solid-state imaging element

TABLE 5

| | Type of composition for partition wall | Type of composition for forming pixel | | | Type of lens material composition |
|---|---|---|---|---|---|
| | | First color | Second color | Third color | |
| Example 1 | Composition 1 for partition wall | Green coloring composition G1 | Red coloring composition R1 | Blue coloring composition B1 | Lens material composition 1 |
| Example 2 | Composition 1 for partition wall | Green coloring composition G1 | Red coloring composition R1 | Blue coloring composition B1 | Lens material composition 1 |
| Example 3 | Composition 1 for partition wall | Green coloring composition G1 | Red coloring composition R1 | Blue coloring composition B1 | Lens material composition 1 |
| Example 4 | Composition 1 for partition wall | Green coloring composition G1 | Red coloring composition R1 | Blue coloring composition B1 | Lens material composition 1 |
| Example 5 | Composition 3 for partition wall | Green coloring composition G1 | Red coloring composition R1 | Blue coloring composition B1 | Lens material composition 1 |
| Example 6 | Composition 1 for partition wall | Green coloring composition G1 | Red coloring composition R1 | Blue coloring composition B1 | Lens material composition 1 |
| Example 7 | Composition 1 for partition wall | Green coloring composition G1 | Red coloring composition R1 | Blue coloring composition B1 | Lens material composition 1 |
| Example 8 | Composition 2 for partition wall | Green coloring composition G1 | Red coloring composition R1 | Blue coloring composition B1 | Lens material composition 1 |
| Example 9 | Composition 1 for partition wall | Green coloring composition G1 | Red coloring composition R1 | Blue coloring composition B1 | Lens material composition 1 |
| Example 10 | Composition 1 for partition wall | Green coloring composition G1 | Red coloring composition R1 | Blue coloring composition B1 | Lens material composition 1 |
| Example 11 | Composition 1 for partition wall | Green coloring composition G1 | Red coloring composition R1 | Blue coloring composition B1 | Lens material composition 1 |
| Example 12 | Composition 1 for partition wall | Green coloring composition G1 | Red coloring composition R1 | Blue coloring composition B1 | Lens material composition 1 |
| Example 13 | Composition 1 for partition wall | Green coloring composition G1 | Red coloring composition R1 | Blue coloring composition B1 | Lens material composition 2 |
| Example 14 | Composition 1 for partition wall | Yellow coloring composition Y1 | Red coloring composition R1 | Blue coloring composition B1 | Lens material composition 1 |
| Example 15 | Composition 1 for partition wall | Yellow coloring composition Y1 | Magenta coloring composition M1 | Cyan coloring composition C1 | Lens material composition 1 |
| Example 16 | Composition 1 for partition wall | Green coloring composition G1 | Red coloring composition R1 | Blue coloring composition B1 | Lens material composition 1 |
| Example 17 | Composition 1 for partition wall | Green coloring composition G1 | Red coloring composition R1 | Blue coloring composition B1 | Lens material composition 1 |
| Example 18 | Composition 1 for partition wall | Green coloring composition G1 | Red coloring composition R1 | Blue coloring composition B1 | Lens material composition 1 |
| Example 19 | Composition 1 for partition wall | Green coloring composition G1 | Red coloring composition R1 | Blue coloring composition B1 | Lens material composition 1 |
| Example 20 | Composition 1 for partition wall | Green coloring composition G1 | Red coloring composition R1 | Blue coloring composition B1 | Lens material composition 1 |
| Example 21 | Composition 1 for partition wall | Green coloring composition G1 | Red coloring composition R1 | Blue coloring composition B1 | Lens material composition 1 |
| Example 22 | Composition 1 for partition wall | Green coloring composition G1 | Red coloring composition R1 | Blue coloring composition B1 | Lens material composition 1 |
| Example 23 | Composition 1 for partition wall | Green coloring composition G1 | Red coloring composition R1 | Blue coloring composition B1 | Lens material composition 1 |
| Example 24 | Composition 1 for partition wall | Green coloring composition G1 | Red coloring composition R1 | Blue coloring composition B1 | Lens material composition 1 |
| Example 25 | Composition 4 for partition wall | Green coloring composition G1 | Red coloring composition R1 | Blue coloring composition B1 | Lens material composition 1 |
| Example 26 | Composition 5 for partition wall | Green coloring composition G1 | Red coloring composition R1 | Blue coloring composition B1 | Lens material composition 1 |
| Example 27 | Composition 6 for partition wall | Green coloring composition G1 | Red coloring composition R1 | Blue coloring composition B1 | Lens material composition 1 |
| Comparative Example 1 | — | Green coloring composition G1 | Red coloring composition R1 | Blue coloring composition B1 | Lens material composition 1 |

TABLE 6

| | Pixel pitch (nm) | Partition wall | | | | Pixel | | | | | |
|---|---|---|---|---|---|---|---|---|---|---|---|
| | | Width (nm) | Height (nm) | Dimension of opening (nm) | Refractive index | First color | | Second color | | Third color | |
| | | | | | | Height (nm) | Refractive index | Height (nm) | Refractive index | Height (nm) | Refractive index |
| Example 1 | 700 | 120 | 350 | 580 | 1.25 | 500 | 1.73 | 500 | 1.69 | 500 | 1.74 |
| Example 2 | 700 | 120 | 350 | 580 | 1.25 | 450 | 1.73 | 450 | 1.69 | 450 | 1.74 |
| Example 3 | 700 | 120 | 350 | 580 | 1.25 | 400 | 1.73 | 400 | 1.69 | 400 | 1.74 |
| Example 4 | 700 | 120 | 350 | 580 | 1.25 | 300 | 1.73 | 300 | 1.69 | 300 | 1.74 |
| Example 5 | 700 | 120 | 350 | 580 | 1.18 | 500 | 1.73 | 500 | 1.69 | 500 | 1.74 |

TABLE 6-continued

| | Pixel pitch (nm) | Partition wall | | | | Pixel | | | | | |
| | | Width (nm) | Height (nm) | Dimension of opening (nm) | Refractive index | First color | | Second color | | Third color | |
| | | | | | | Height (nm) | Refractive index | Height (nm) | Refractive index | Height (nm) | Refractive index |
|---|---|---|---|---|---|---|---|---|---|---|---|
| Example 6 | 700 | 120 | 450 | 580 | 1.25 | 500 | 1.73 | 500 | 1.69 | 500 | 1.74 |
| Example 7 | 700 | 120 | 550 | 580 | 1.25 | 500 | 1.73 | 500 | 1.69 | 500 | 1.74 |
| Example 8 | 700 | 120 | 350 | 580 | 1.22 | 500 | 1.73 | 500 | 1.69 | 500 | 1.74 |
| Example 9 | 700 | 120 | 500 | 580 | 1.25 | 500 | 1.73 | 500 | 1.69 | 500 | 1.74 |
| Example 10 | 700 | 100 | 500 | 600 | 1.25 | 500 | 1.73 | 500 | 1.69 | 500 | 1.74 |
| Example 11 | 700 | 150 | 500 | 550 | 1.25 | 500 | 1.73 | 500 | 1.69 | 500 | 1.74 |
| Example 12 | 700 | 80 | 500 | 620 | 1.25 | 500 | 1.73 | 500 | 1.69 | 500 | 1.74 |
| Example 13 | 700 | 120 | 500 | 580 | 1.25 | 500 | 1.73 | 500 | 1.69 | 500 | 1.74 |
| Example 14 | 700 | 120 | 500 | 580 | 1.25 | 500 | 1.61 | 500 | 1.69 | 500 | 1.74 |
| Example 15 | 700 | 120 | 500 | 580 | 1.25 | 500 | 1.61 | 500 | 1.62 | 500 | 1.70 |
| Example 16 | 900 | 120 | 500 | 780 | 1.25 | 500 | 1.73 | 500 | 1.69 | 500 | 1.74 |
| Example 17 | 800 | 120 | 500 | 680 | 1.25 | 500 | 1.73 | 500 | 1.69 | 500 | 1.74 |
| Example 18 | 650 | 120 | 500 | 530 | 1.25 | 500 | 1.73 | 500 | 1.69 | 500 | 1.74 |
| Example 19 | 600 | 120 | 500 | 480 | 1.25 | 500 | 1.73 | 500 | 1.69 | 500 | 1.74 |
| Example 20 | 550 | 120 | 500 | 430 | 1.25 | 500 | 1.73 | 500 | 1.69 | 500 | 1.74 |
| Example 21 | 700 | 120 | 510 | 580 | 1.25 | 500 | 1.73 | 500 | 1.69 | 500 | 1.74 |
| Example 22 | 700 | 120 | 490 | 580 | 1.25 | 500 | 1.73 | 500 | 1.69 | 500 | 1.74 |
| Example 23 | 700 | 120 | 500 | 580 | 1.25 | 510 | 1.73 | 510 | 1.69 | 510 | 1.74 |
| Example 24 | 700 | 120 | 500 | 580 | 1.25 | 490 | 1.73 | 490 | 1.69 | 490 | 1.74 |
| Example 25 | 700 | 120 | 500 | 580 | 1.27 | 500 | 1.73 | 500 | 1.69 | 500 | 1.74 |
| Example 26 | 700 | 120 | 500 | 580 | 1.29 | 500 | 1.73 | 500 | 1.69 | 500 | 1.74 |
| Example 27 | 700 | 120 | 500 | 580 | 1.29 | 500 | 1.73 | 500 | 1.69 | 500 | 1.74 |
| Comparative Example 1 | 700 | — | — | — | — | 500 | 1.73 | 500 | 1.69 | 500 | 1.74 |

<Evaluation>

With regard to the solid-state imaging elements Examples and Comparative Example, a sensitivity (QE0) of the silicon photodiode at a part corresponding to each pixel to light emitted from a direction perpendicular to the silicon photodiode and a sensitivity (QE30) of the silicon photodiode at a part corresponding to each pixel to light emitted from an angular direction of 30 degrees with respect to the silicon photodiode were measured, respectively, and a sensitivity ratio (QE0/QE30) was calculated. The results are shown in the table below. As the sensitivity ratio is closer to 1, the sensitivity to light in an oblique direction is better. In addition, the sensitivity was measured by measuring a charge obtained from the silicon photodiode.

TABLE 7

| | Sensitivity ratio (QE0/QE30) | |
|---|---|---|
| | Colored layer of first color | Colored layer of third color |
| Example 1 | 1.26 | 1.38 |
| Example 2 | 1.25 | 1.32 |
| Example 3 | 1.24 | 1.23 |
| Example 4 | 1.23 | 1.17 |
| Example 5 | 1.20 | 1.20 |
| Example 6 | 1.21 | 1.30 |
| Example 7 | 1.16 | 1.25 |
| Example 8 | 1.25 | 1.36 |
| Example 9 | 1.18 | 1.26 |
| Example 10 | 1.19 | 1.27 |
| Example 11 | 1.20 | 1.28 |
| Example 12 | 1.23 | 1.30 |
| Example 13 | 1.18 | 1.26 |
| Example 14 | 1.18 | 1.26 |
| Example 15 | 1.18 | 1.18 |
| Example 16 | 1.13 | 1.21 |
| Example 17 | 1.15 | 1.24 |
| Example 18 | 1.20 | 1.29 |
| Example 19 | 1.21 | 1.31 |
| Example 20 | 1.25 | 1.35 |
| Example 21 | 1.17 | 1.25 |
| Example 22 | 1.20 | 1.28 |
| Example 23 | 1.19 | 1.27 |
| Example 24 | 1.17 | 1.24 |
| Example 25 | 1.22 | 1.29 |
| Example 26 | 1.22 | 1.30 |
| Example 27 | 1.22 | 1.30 |
| Comparative Example 1 | 1.35 | 1.49 |

As is clear from the above-described results, Examples had a sensitivity ratio closer to 1 than Comparative Example, so that Examples were superior in sensitivity to light in an oblique direction. In addition, in the solid-state imaging elements of Examples, compared to the solid-state imaging element of Comparative Example, a variation in sensitivity characteristics between the central portion and the peripheral portion of the silicon photodiode was small, and a clearer image could be obtained. In addition, the same effect was obtained even in a case where the green coloring composition G1 was changed to G2 to G7.

EXPLANATION OF REFERENCES

1: support

10: photoelectric conversion unit

20: optical filter

21 to 23: pixel

25: partition wall
30: microlens
100: solid-state imaging element

What is claimed is:

1. A solid-state imaging element comprising:
a support having a photoelectric conversion unit; and
an optical filter provided on a light incident side with respect to the photoelectric conversion unit,
wherein the optical filter has two or more kinds of pixels arranged in a patterned manner and a partition wall disposed between the pixels,
a refractive index of the partition wall with respect to light having a wavelength of 533 nm is 1.10 to 1.30,
a width of the partition wall is 80 to 150 nm,
a refractive index of the pixels with respect to light having a wavelength of 1000 nm is 1.60 to 1.90,
a difference between a thickness of the partition wall and a thickness of pixels adjacent to the partition wall is 200 nm or less,
a difference between the refractive index of the partition wall with respect to light having a wavelength of 533 nm and a refractive index of the pixels adjacent to the partition wall with respect to light having a wavelength of 1000 nm is 0.30 to 0.80, and
the thickness of the partition wall is larger than a thickness of the pixels.

2. The solid-state imaging element according to claim 1, wherein the thickness of the partition wall is 300 to 650 nm.

3. The solid-state imaging element according to claim 1, wherein a thickness of the pixels is 300 to 600 nm.

4. The solid-state imaging element according to claim 1, wherein a width of the pixels is 300 to 1100 nm.

5. The solid-state imaging element according to claim 1, wherein a pixel pitch of the optical filter is 400 to 1200 nm.

6. The solid-state imaging element according to claim 1, wherein the difference between the thickness of the partition wall and the thickness of pixels adjacent to the partition wall is 1 nm or more.

7. The solid-state imaging element according to claim 1, wherein a void ratio of the partition wall is 20% to 80%.

8. The solid-state imaging element according to claim 1, further comprising:
an underlayer between the partition wall and a pixel side.

9. The solid-state imaging element according to claim 1, wherein the optical filter includes at least one kind of pixel selected from a yellow pixel, a cyan pixel, or a magenta pixel.

10. A solid-state imaging element comprising:
a support having a photoelectric conversion unit; and
an optical filter provided on a light incident side with respect to the photoelectric conversion unit,
wherein the optical filter has two or more kinds of pixels arranged in a patterned manner and a partition wall disposed between the pixels,
a refractive index of the partition wall with respect to light having a wavelength of 533 nm is 1.10 to 1.30,
a width of the partition wall is 80 to 150 nm,
a refractive index of the pixels with respect to light having a wavelength of 1000 nm is 1.60 to 1.90,
a difference between a thickness of the partition wall and a thickness of pixels adjacent to the partition wall is 200 nm or less,
a difference between the refractive index of the partition wall with respect to light having a wavelength of 533 nm and a refractive index of the pixels adjacent to the partition wall with respect to light having a wavelength of 1000 nm is 0.30 to 0.80, and
the partition wall includes at least one kind selected from silica particles having a shape in which a plurality of spherical silica particles are linked in a beaded shape or silica particles having a hollow structure.

11. A solid-state imaging element comprising:
a support having a photoelectric conversion unit; and
an optical filter provided on a light incident side with respect to the photoelectric conversion unit,
wherein the optical filter has two or more kinds of pixels arranged in a patterned manner and a partition wall disposed between the pixels,
a refractive index of the partition wall with respect to light having a wavelength of 533 nm is 1.10 to 1.30,
a width of the partition wall is 80 to 150 nm,
a refractive index of the pixels with respect to light having a wavelength of 1000 nm is 1.60 to 1.90,
a difference between a thickness of the partition wall and a thickness of pixels adjacent to the partition wall is 200 nm or less,
a difference between the refractive index of the partition wall with respect to light having a wavelength of 533 nm and a refractive index of the pixels adjacent to the partition wall with respect to light having a wavelength of 1000 nm is 0.30 to 0.80, and
a surface roughness Ra value of the pixels is 0.1 to 5.0 nm.

* * * * *